(12) United States Patent
Shimizu

(10) Patent No.: US 9,397,083 B2
(45) Date of Patent: Jul. 19, 2016

(54) SEMICONDUCTOR DEVICE INCLUDING PROTRUDING POWER SUPPLY WIRINGS WITH BENT PORTIONS AT ENDS THEREOF

(75) Inventor: Hiroharu Shimizu, Kanagawa (JP)

(73) Assignee: RENESAS ELECTRONICS CORPORATION, Kawasaki-Shi, Kanagawa (JP)

( * ) Notice: Subject to any disclaimer, the term of this patent is extended or adjusted under 35 U.S.C. 154(b) by 740 days.

(21) Appl. No.: 13/522,003

(22) PCT Filed: Feb. 3, 2010

(86) PCT No.: PCT/JP2010/051516
§ 371 (c)(1),
(2), (4) Date: Jul. 12, 2012

(87) PCT Pub. No.: WO2011/096055
PCT Pub. Date: Aug. 11, 2011

(65) Prior Publication Data
US 2012/0299065 A1    Nov. 29, 2012

(51) Int. Cl.
*H01L 23/52* (2006.01)
*H01L 27/02* (2006.01)
*H01L 27/118* (2006.01)
*H01L 31/075* (2012.01)
(Continued)

(52) U.S. Cl.
CPC ...... *H01L 27/0207* (2013.01); *H01L 27/11803* (2013.01); *H01L 27/092* (2013.01); *H01L 27/1446* (2013.01); *H01L 31/03926* (2013.01); *H01L 31/075* (2013.01); *H01L 2027/11861* (2013.01); *H01L 2027/11881* (2013.01)

(58) Field of Classification Search
CPC .............. H01L 27/0207; H01L 27/092; H01L 27/11803; H01L 27/1446; H01L 31/075; H01L 31/03926; H01L 2027/11861; H01L 2027/11881
See application file for complete search history.

(56) References Cited

U.S. PATENT DOCUMENTS

2005/0205894 A1    9/2005  Sumikawa et al.
2005/0274983 A1*  12/2005  Hayashi et al. ............... 257/206
(Continued)

FOREIGN PATENT DOCUMENTS

JP          10-144794 A      5/1998
JP       2005-268610 (A)    9/2005
(Continued)

OTHER PUBLICATIONS

Notification of Reason(s) for Refusal dated dated Nov. 12, 2013, with English translation.
(Continued)

*Primary Examiner* — Caleb Henry
*Assistant Examiner* — Alexander Belousov
(74) *Attorney, Agent, or Firm* — McGinn IP Law Group, PLLC.

(57) ABSTRACT

There is provided a technique capable of reducing a layout area of a standard cell configuring a digital circuit even under a circumstance that a new layout rule introduced in accordance with microfabrication of a MISFET is provided. For example, a protruding wiring PL1A protrudes from a power supply wiring L1A at each corner of both ends of a standard cell CL toward an inside of the standard cell CL (in a Y direction), and a bent portion BD1A which is bent from the protruding wiring PL1A in an X direction is formed. And, this bent portion BD1A and a p-type semiconductor region PDR are connected to each other via a plug PLG.

25 Claims, 23 Drawing Sheets

(51) Int. Cl.
  *H01L 31/0392* (2006.01)
  *H01L 27/144* (2006.01)
  *H01L 27/092* (2006.01)

(56) References Cited

U.S. PATENT DOCUMENTS

| | | | |
|---|---|---|---|
| 2005/0280031 | A1 | 12/2005 | Yano |
| 2006/0119392 | A1* | 6/2006 | Nozoe et al. .................. 326/101 |
| 2007/0111405 | A1* | 5/2007 | Watanabe ........... H01L 27/0207 438/142 |
| 2007/0228419 | A1 | 10/2007 | Komaki |
| 2008/0105904 | A1 | 5/2008 | Sumikawa et al. |
| 2008/0105929 | A1 | 5/2008 | Eimitsu et al. |
| 2008/0224176 | A1 | 9/2008 | Nakanishi et al. |
| 2008/0283871 | A1 | 11/2008 | Hamada |
| 2009/0085067 | A1 | 4/2009 | Hayashi et al. |
| 2010/0059794 | A1* | 3/2010 | Shimizu et al. ............... 257/206 |
| 2010/0133625 | A1 | 6/2010 | Hamada |
| 2010/0187699 | A1 | 7/2010 | Nishimura et al. |
| 2010/0308377 | A1 | 12/2010 | Nakanishi et al. |

FOREIGN PATENT DOCUMENTS

| | | |
|---|---|---|
| JP | 2005-353905 (A) | 12/2005 |
| JP | 2006-5103 (A) | 1/2006 |
| JP | 2006-73696 (A) | 3/2006 |
| JP | 2007-141971 (A) | 6/2007 |
| JP | 2007-273762 A | 10/2007 |
| JP | 2008-118004 A | 5/2008 |
| JP | 2008-235350 (A) | 10/2008 |
| JP | 2008-288268 (A) | 11/2008 |
| JP | 2010-16258 (A) | 1/2010 |
| TW | 442954 B | 6/2001 |
| WO | WO 2010/001506 A1 | 1/2010 |

OTHER PUBLICATIONS

International Search Report in PCT/JP2010/051516 dated Mar. 2, 2010 (English Translation Thereof).
Japanese Office Action dated Jul. 23, 2013, with English translation.
Taiwanese Office Action dated Jun. 11, 2015 with English translation.
Korean Office Action dated Nov. 6, 2015 with an English translation.
Taiwanese Office Action dated Apr. 21, 2016 (with Search Report) with an English translation.

* cited by examiner

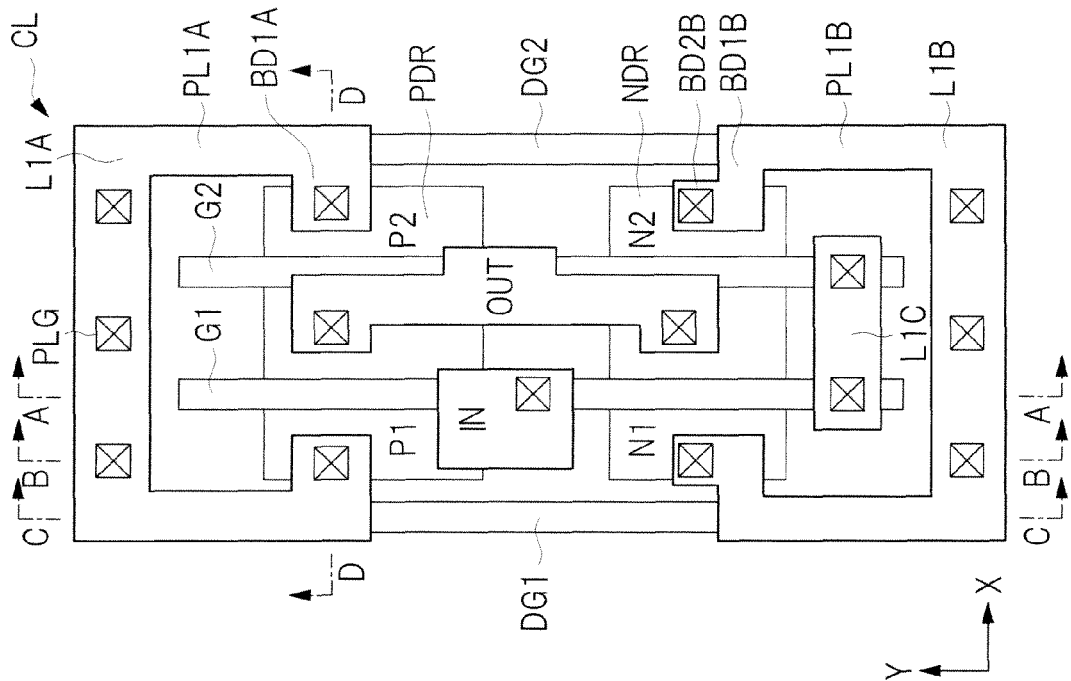
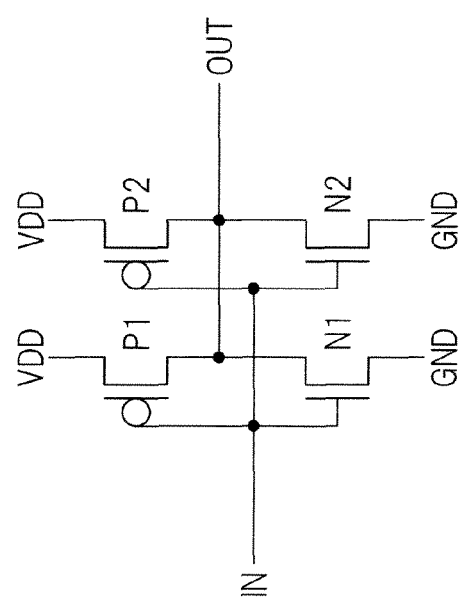
FIG. 4A
FIG. 4B

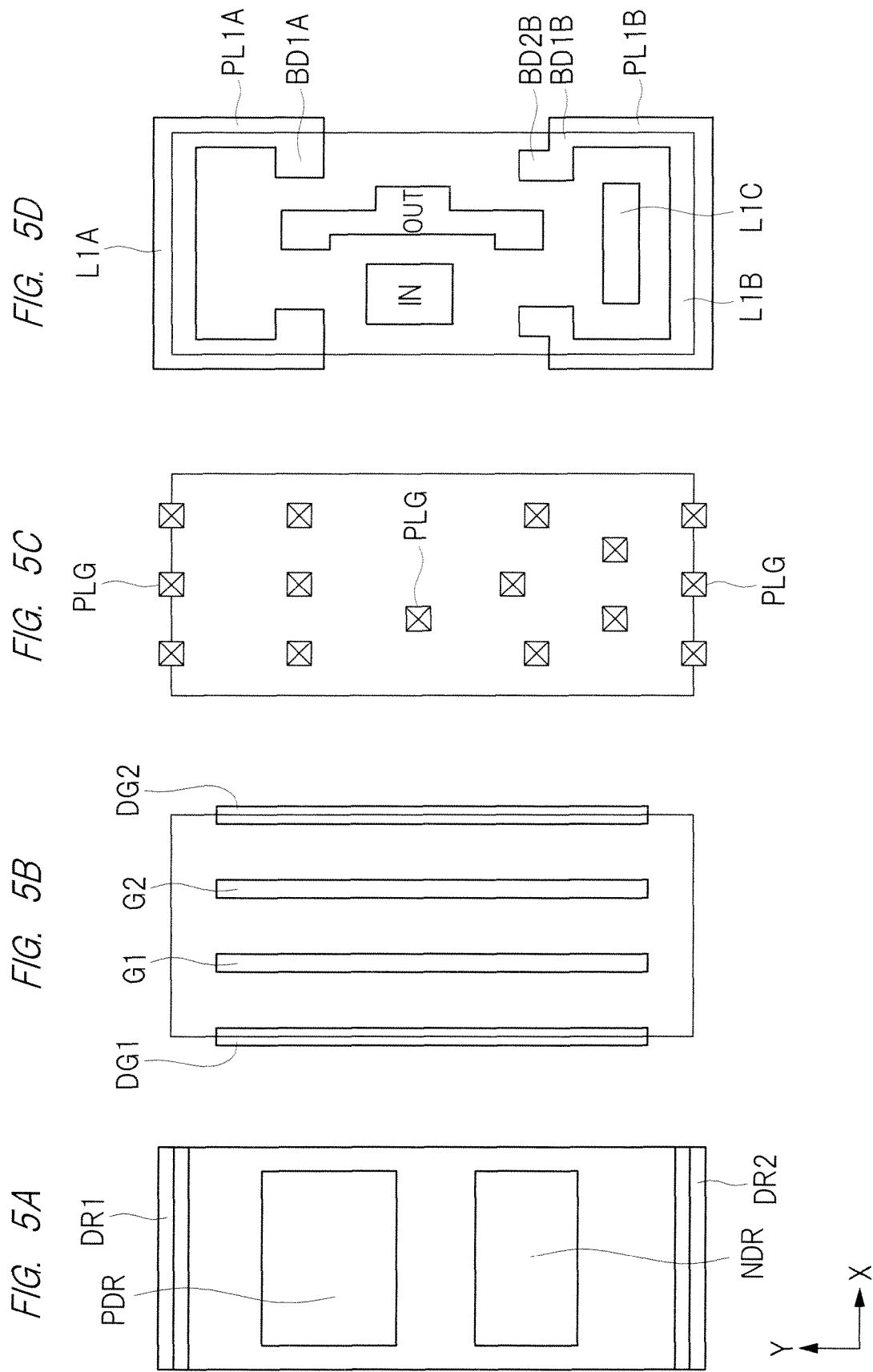

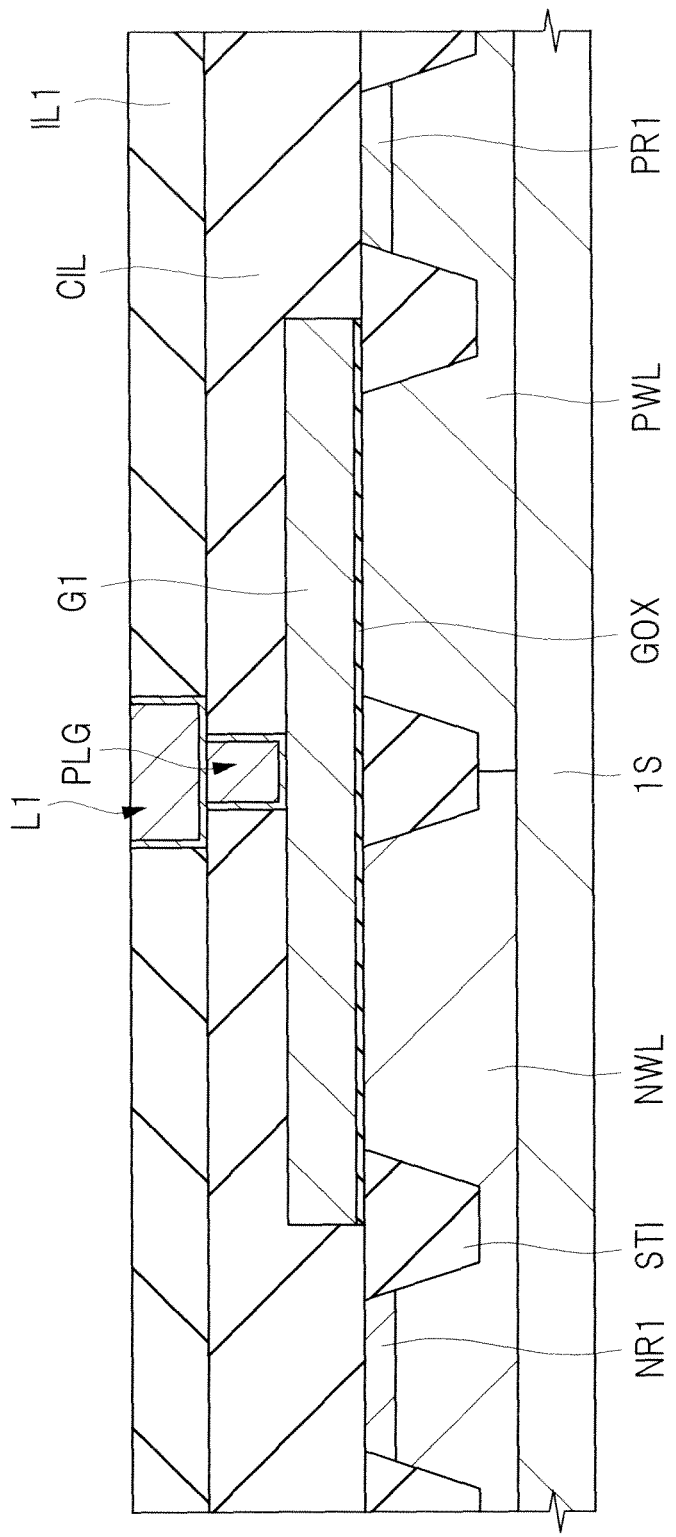

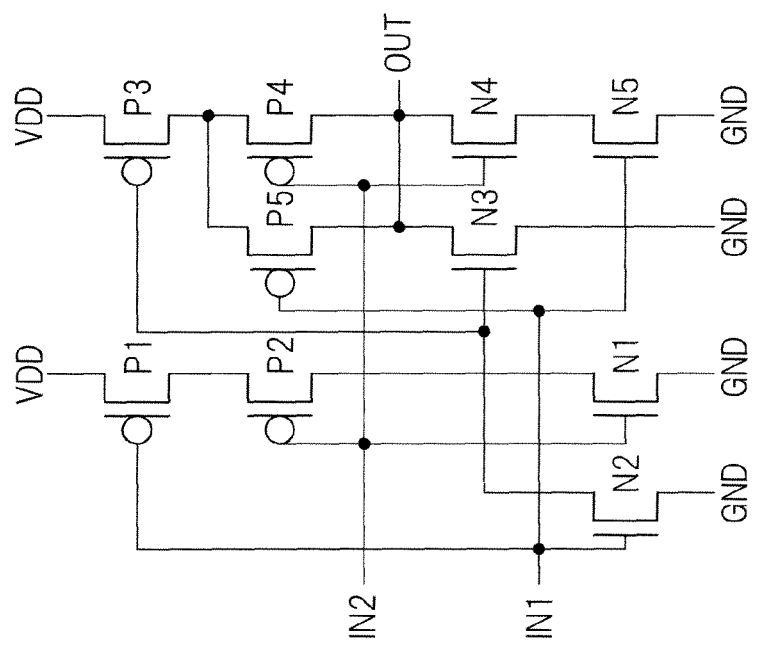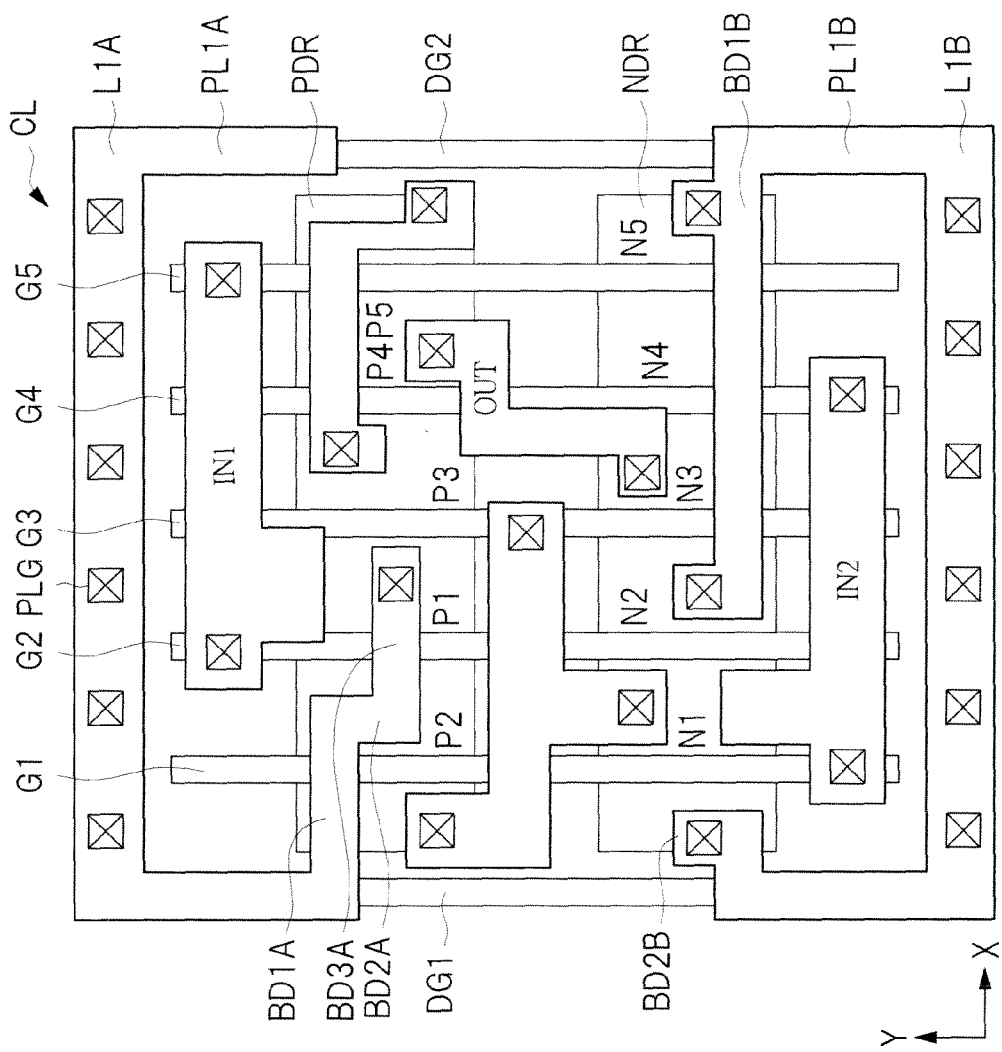

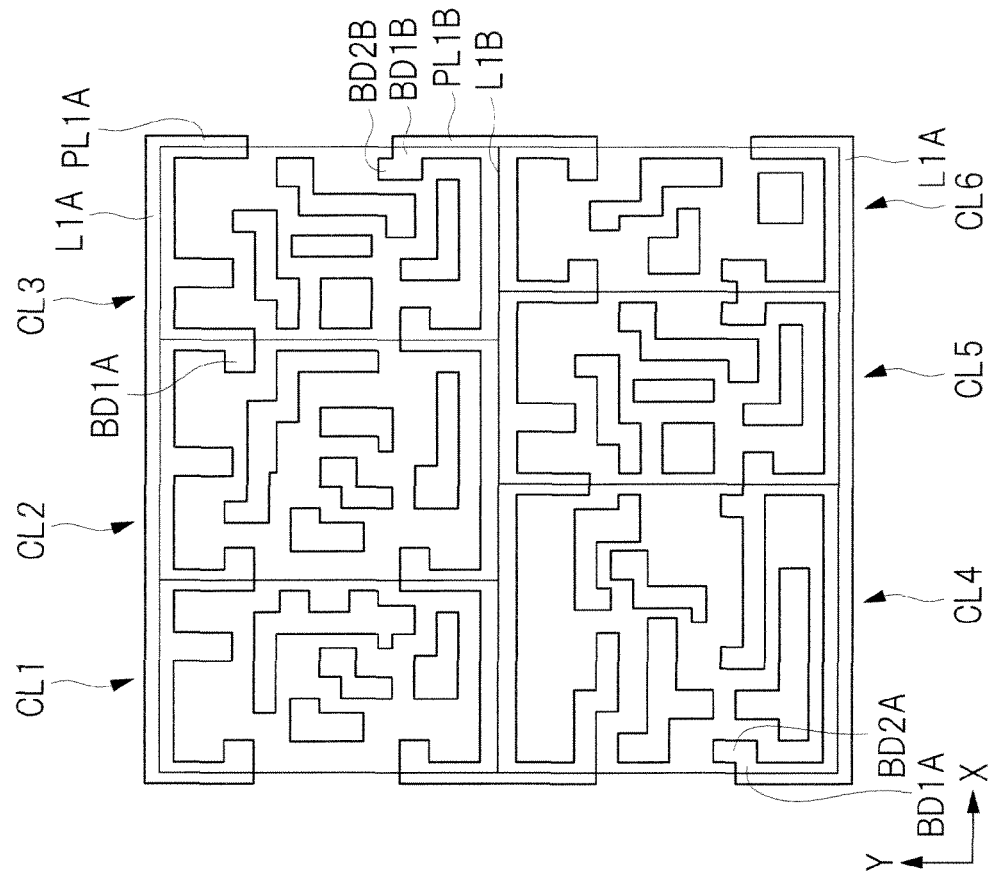
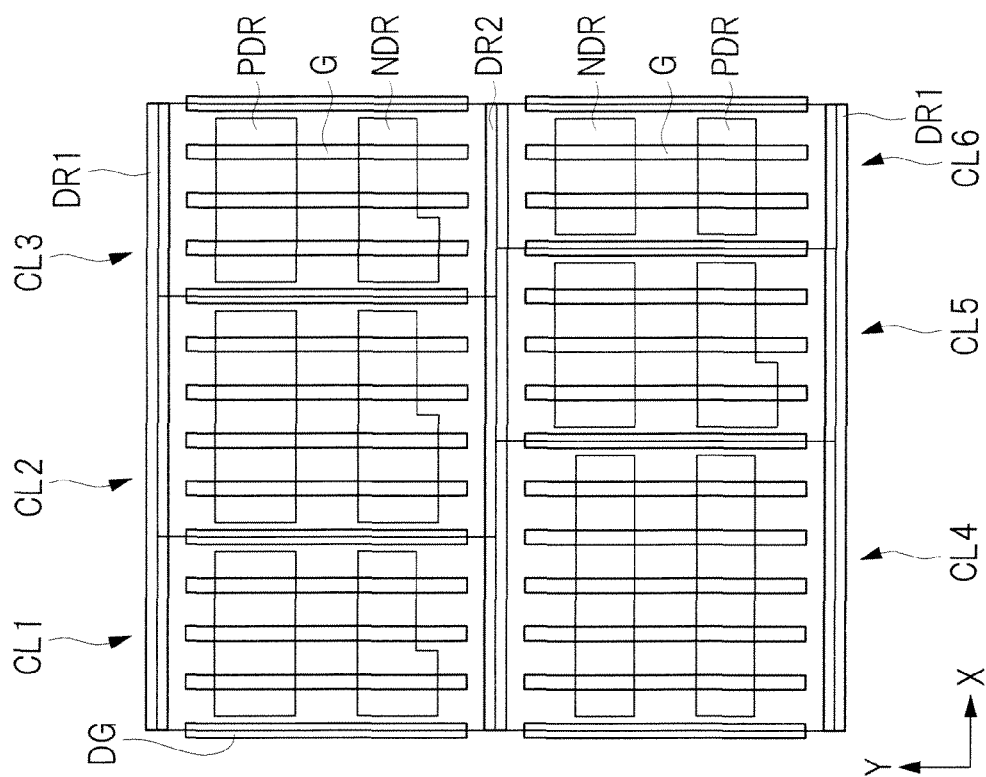

SEMICONDUCTOR DEVICE INCLUDING PROTRUDING POWER SUPPLY WIRINGS WITH BENT PORTIONS AT ENDS THEREOF

TECHNICAL FIELD

The present invention relates to a semiconductor device, and, more particularly, the present invention relates to a technique effectively applied to a semiconductor device including a logic circuit using a standard cell.

BACKGROUND ART

Japanese Patent Application Laid-Open Publication No. 2008-118004 (Patent Document 1) describes a layout structure in which a power supply wiring connected to a diffusion layer is drawn onto boundary line between adjacent standard cells. More specifically, Patent Document 1 describes a layout structure in which a diffusion layer is shared between adjacent standard cells and a wiring is drawn from a power supply wiring onto boundary line between the adjacent standard cells. And, Patent Document 1 describes a structure in which the wiring drawn on the boundary line between the adjacent standard cells and the diffusion layer shared between the adjacent standard cells are electrically connected to each other via a plug.

PRIOR ART DOCUMENT

Patent Document

Patent Document 1: Japanese Patent Application Laid-Open Publication No. 2008-118004

DISCLOSURE OF THE INVENTION

Problems to be Solved by the Invention

Many integrated circuits are formed on a semiconductor device, and these integrated circuits are configured of an analog circuit or a digital circuit. More particularly, as a layout design technique of the digital circuit, a design technique of using a standard cell is widely used. For example, a unit circuit such as an inverter circuit, a NAND circuit, an EXOR circuit, or a flip-flop circuit is prepared as the standard cell, and this standard cell is arranged in rows. And, a wiring is designed so as to configure an integrated circuit for the plurality of standard cells arranged in rows, so that a digital circuit (for example, a logic circuit) having a predetermined function is formed.

Here, since each of the plurality of standard cells requires a power supply for operation, a power supply wiring (VDD) and a reference wiring (GND) are arranged so as to sandwich the plurality of standard cells arranged in rows thereby to supply a power voltage and a reference voltage to each of the standard cells via a drawing-out wiring drawn out from these power supply wiring (VDD) and the reference wiring (GND). That is, the power supply wiring (VDD) and the reference wiring (GND) are formed so as to extend in parallel to each other in a predetermined direction, and the plurality of standard cells are arranged in a predetermined direction so as to be sandwiched by these power supply wiring (VDD) and the reference wiring (GND). Since each of the standard cells is configured of a plurality of transistors, a diffusion layer and a gate electrode configuring the transistors are formed on each of the standard cells.

Conventionally, there has been no restraint in a layout rule for a shape of the diffusion layer and a shape of the gate electrode configuring the standard cell, and therefore, a diffusion layer and a gate electrode in any shape could have been formed. Therefore, by contriving the shape of the diffusion layer and the shape of the gate electrode, the layout of the standard cell could have been freely designed so that an area of the integrated circuit is small.

However, in recent years, microfabrication of the transistor (MISFET (Metal Insulator Semiconductor Field Effect Transistor)) configuring the integrated circuit has been advanced, and microfabrication of the diffusion layer and the gate electrode configuring the MISFET has been advanced. These diffusion layer and gate electrode are formed by using a photolithography technique, and process accuracy of the photolithography technique increasingly becomes an issue as advancing the microfabrication of the diffusion layer and the gate electrode. That is, while the shape of the diffusion layer and the shape of the gate electrode have been contrived so that the layout of the standard cell is minimized, it has been difficult to form a diffusion layer and a gate electrode each having a contrived complex shape in accordance with a designed value due to the issue of the process accuracy of the photolithography technique caused with the microfabrication of the diffusion layer and the gate electrode.

For example, in a case that the diffusion layer has a complex polygonal shape or a case that a bent portion is formed in the gate electrode, when a corner is shaped as being rounded, deterioration in shape tends to occur due to the issue of the process accuracy of the photolithography technique. In this case, the shapes of the diffusion layer and the gate electrode deviate from the designed values, and therefore, variation in performance among the MISFETs adversely occur.

Accordingly, for example, when a MISFET microfabricated so as to be smaller than a 28-nm node is formed, certain restraint is provided to the layout rule in order to equalize (uniform) the performances of the formed MISFETs. That is, when the MISFET is microfabricated, it is difficult to accurately form the complex shape due to the issue of the process accuracy of the photolithography technique, and therefore, a rule for simplifying the shapes of the diffusion layer and the gate electrode configuring the MISFET is set to ensure the performance of the microfabricated MISFET. As a specifically-set layout rule, a rule that gate electrodes (polysilicon films) are arranged at the same interval and the gate electrodes have straight-line shapes without being bent at all or a rule that a diffusion layer has a figure shape with eight or less vertexes is provided.

When the layout of the standard cell is designed under a circumstance of the provision of such a new layout rule, a problem of increase in the area of the standard cell arises.

A preferred aim of the present invention is to provide a technique capable of decreasing a layout area of a standard cell configuring a digital circuit even in a circumstance of provision of a layout rule newly introduced in accordance with microfabrication of a MISFET.

The above and other preferred aims and novel characteristics of the present invention will be apparent from the description of the present specification and the accompanying drawings.

Means for Solving the Problems

The typical ones of the inventions disclosed in the present application will be briefly described as follows.

A semiconductor device according to a typical embodiment includes: a first power supply wiring of a first wiring layer which extends on a first side along a first direction; and a second power supply wiring of the first wiring layer which extends on a second side so as to be distant at a predetermined interval from and in parallel to the first side and to which a voltage lower than that of the first power supply wiring is applied. Further, the semiconductor device includes: two first protruding wirings which branch from the first power supply wiring at both ends of the first side and which protrude in the second direction toward an inside of the standard cell; and two second protruding wirings which branch from the second power supply wiring at both ends of the second side and which protrude in the second direction toward inside of the standard cell. Here, at least one or more protruding wirings extracted from the first protruding wirings and the second protruding wirings include a first bent portion whose end is bent in the first direction toward the inside of the standard cell.

Also, a semiconductor device according to a typical embodiment includes a plurality of standard cells adjacently arranged along a first direction of a semiconductor substrate. Here, each of the plurality of standard cells having a rectangular shape includes: (a) a first power supply wiring of a first wiring layer which extends on a first side along the first direction; and (b) a second power supply wiring of the first wiring layer which extends on a second side so as to be distant at a predetermined interval from and in parallel to the first side and to which a voltage lower than that of the first power supply wiring is applied. And, each of the plurality of standard cells includes: (c) a first semiconductor region and a second semiconductor region which are arranged so as to line in a second direction crossing the first direction between the first power supply wiring and the second power supply wiring within the semiconductor substrate, the first semiconductor region being arranged on a side of the first power supply wiring and the second semiconductor region being arranged on a side of the second power supply wiring; and (d) a plurality of gate electrodes which extend in the second direction and which are formed on the semiconductor substrate at the same interval in the first direction. Also, each of the plurality of standard cells further includes: (e) two first protruding wirings which branch from the first power supply wiring at both ends of the first side and which protrude in the second direction toward the inside of the standard cell; and (f) two second protruding wirings which branch from the second power supply wiring at both ends of the second side and which protrude in the second direction toward the inside of the standard cell. Here, at least one or more protruding wirings extracted from the first protruding wirings and the second protruding wirings include a first bent portion whose end is bent in the first direction toward the inside of the standard cell. And, when the protruding wiring including the first bent portion formed therein branches from the first power supply wiring, the protruding wiring is electrically connected to the first semiconductor region via a first plug connected to the first bent portion. On the other hand, when the protruding wiring including the first bent portion formed therein branches from the second power supply wiring, the protruding wiring is electrically connected to the second semiconductor region via a second plug connected to the first bent portion.

Moreover, a semiconductor device according to a typical embodiment includes a plurality of standard cells adjacently arranged along a first direction of a semiconductor substrate. Here, each of the plurality of standard cells having a rectangular shape includes: (a) a first power supply wiring of a first wiring layer which extends on a first side along the first direction; and (b) a second power supply wiring of the first wiring layer which extends on a second side so as to be distant at a predetermined interval from and in parallel to the first side and to which a voltage lower than that of the first power supply wiring is applied. And, each of the plurality of standard cells includes: (c) a first semiconductor region and a second semiconductor region which are arranged so as to line in a second direction crossing the first direction between the first power supply wiring and the second power supply wiring within the semiconductor substrate, the first semiconductor region being arranged on a side of the first power supply wiring and the second semiconductor region being arranged on a side of the second power supply wiring; and (d) a plurality of gate electrodes which extend in the second direction and which are formed on the semiconductor substrate at the same interval in the first direction. Also, each of the plurality of standard cells further includes: (e) two first protruding wirings which branch from the first power supply wiring at both ends of the first side and which protrude in the second direction toward the inside of the standard cell; and (f) two second protruding wirings which branch from the second power supply wiring at both ends of the second side and which protrude in the second direction toward the inside of the standard cell. One first gate electrode among the plurality of gate electrodes is arranged so as to overlap in a plane with a first boundary line which connects between one end of the first side and one end of the second side. On the other hand, one second gate electrode among the plurality of gate electrodes is arranged so as to overlap in a plane with a second boundary line which connects between the other end of the first side and the other end of the second side.

Effects of the Invention

The effects obtained by typical embodiments of the present invention disclosed in the present application will be briefly described below.

A layout area of a standard cell configuring a digital circuit can be decreased even in a circumstance of provision of a layout rule newly introduced in accordance with microfabrication of a MISFET.

BRIEF DESCRIPTIONS OF THE DRAWINGS

FIGS. 4A and 4B are a circuit diagram illustrating two inverter circuits parallely connected between an input wiring and an output wiring and a plan view illustrating an example of a layout structure of the inverter circuits illustrated in FIG. 4A, respectively;

FIGS. 5A to 5D are diagrams illustrating to dissolve the layout structure of the inverter circuits into respective layers;

FIG. 6 is a cross-sectional view cut along a line A-A in FIG. 4B;

FIGS. 10A and 10B are a circuit diagram illustrating an EX-OR circuit connected between an input wiring and an output wiring and a plan view illustrating an example of a layout structure of the EX-OR circuit illustrated in FIG. 10A, respectively;

FIGS. 13A and 13B are diagrams illustrating a layout structure in which a plurality of standard cells having different functions are arranged, FIG. 13A is a diagram illustrating a lower layer obtained by dissolving the standard cells into two layers, and, on the other hand, FIG. 13B is a diagram illustrating an upper layer obtained by dissolving the standard cells into two layers;

BEST MODE FOR CARRYING OUT THE INVENTION

In the embodiments described below, the invention will be described in a plurality of sections or embodiments when required as a matter of convenience. However, these sections or embodiments are not irrelevant to each other unless otherwise stated, and the one relates to the entire or a part of the other as a modification example, details, or a supplementary explanation thereof.

Also, in the embodiments described below, when referring to the number of elements (including number of pieces, values, amount, range, and the like), the number of the elements is not limited to a specific number unless otherwise stated or except the case where the number is apparently limited to a specific number in principle. The number larger or smaller than the specific number is also applicable.

Further, in the embodiments described below, it goes without saying that the components (also including element steps or the like) are not always indispensable unless otherwise stated or except the case where the components are apparently indispensable in principle.

Similarly, in the embodiments described below, when the shape of the components, positional relation thereof, and the like are mentioned, the substantially approximate and similar shapes and the like are included therein unless otherwise stated or except the case where it is conceivable that they are apparently excluded in principle. The same goes for the numerical value and the range described above.

In addition, the same components are denoted by the same reference symbols throughout all drawings for describing the embodiments, and the repetitive description thereof will be omitted. Note that hatching is used even in a plan view so as to make the drawings easy to see.

First Embodiment

Figure 1:
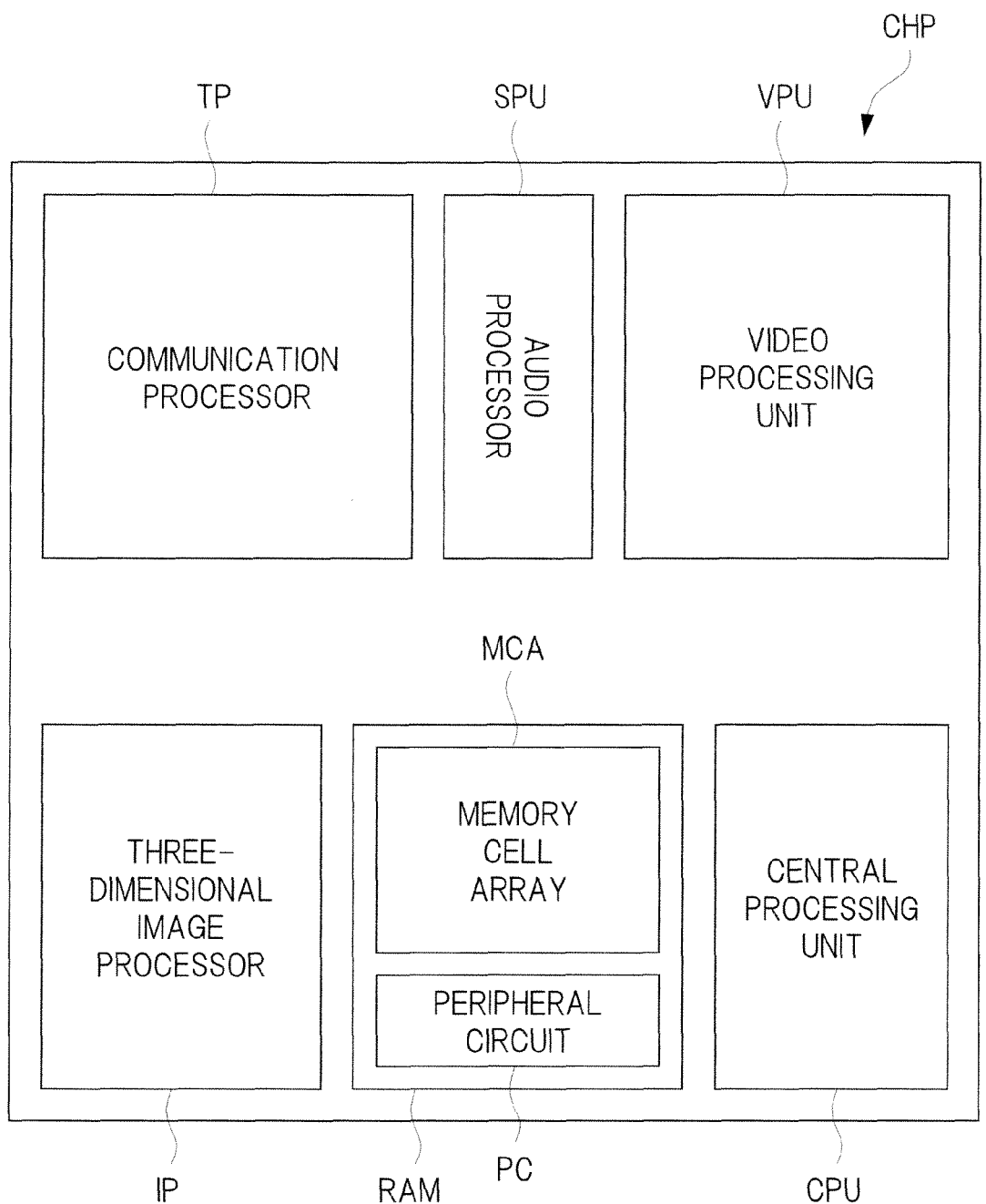
FIG. 1 is a plan view illustrating a structure of a semiconductor chip in a first embodiment of the present invention.

FIG. 1 is a plan view illustrating a structure of a semiconductor chip CHP in a first embodiment. In FIG. 1, the semiconductor chip CHP in the first embodiment includes: a communication processor TP; an audio processor SPU; a video processing unit VPU; a three-dimensional image processor IP; and a central processing unit CPU.

The communication processor TP is a processor having a function of communicating with a device connected to an outside of the semiconductor chip, and the audio processor SPU is a processor used in recording and reproducing music. Also, the video processing unit VPU is a processor used in recording and reproducing video (moving picture), and the three-dimensional image processor IP is a processor for processing three-dimensional image data. Further, the central processing unit CPU is also called a central computing device, and corresponds to a heart of a computer or others. This central processing unit CPU reads an instruction from a storage device, decodes the instruction, and performs various types of computation and control based on the decoding results. These communication processor TP, audio processor SPU, video processing unit VPU, three-dimensional image processor IP, and central processing unit CPU are configured of digital circuits (logic circuits). Many digital circuits are formed on the semiconductor chip CHP as described above. However, in addition to those described above, the digital circuits are also used for components such as a peripheral circuit PC of a memory RAM configured of a memory cell array MCA and the peripheral circuit PC, a serial interface (serial I/F), a timer, a clock division circuit included in a PLL (Phase Locked Loop) circuit, and others. As a technique of a layout design of such a digital circuit, a design technique using a standard cell is widely used. For example, unit circuits such as an inverter circuit, a NAND circuit, an EXOR circuit, and a flip-flop circuit are prepared as the standard cells, and these standard cells are arranged in rows. And, wiring design is performed so that an integrated circuit is configured for the plurality of standard cells arranged in rows, so that a digital circuit (for example, logic circuit) having a predetermined function is formed. Since each of the standard cells is configured of a plurality of transistors, a diffusion layer and a gate electrode configuring the transistor are formed in each of the standard cells.

Conventionally, there has been no restraint in a layout rule for the shape of the diffusion layer and the shape of the gate electrode configuring the standard cell, and therefore, a diffusion layer and a gate electrode having any shape could have been formed. Therefore, by contriving the shape of the diffusion layer and the shape of the gate electrode, the layout of the standard cell could have been freely designed so that an area of the integrated circuit is small.

However, in recent years, microfabrication of a transistor (MISFET) configuring the integrated circuit has been advanced, and microfabrication of the diffusion layer and the gate electrode configuring the MISFET has been advanced. These diffusion layer and gate electrode are formed by using a photolithography technique, and process accuracy of the photolithography technique increasingly becomes an issue as advancing the microfabrication of the diffusion layer and the gate electrode. That is, while the shape of the diffusion layer and the shape of the gate electrode have been contrived so that the layout of the standard cell is minimized, it has been difficult to form a diffusion layer and a gate electrode each having a contrived complex shape in accordance with a designed value due to the issue of the process accuracy of the photolithography technique caused with the microfabrication of the diffusion layer and the gate electrode.

For example, in a case that the diffusion layer has a complex polygonal shape or a case that a bent portion is formed in the gate electrode, when a corner is shaped as being rounded, deterioration in shape tends to occur due to the issue of the process accuracy of the photolithography technique. In this case, the shapes of the diffusion layer and the gate electrode deviate from the designed values, and therefore, variation in performance among the MISFETs adversely occur.

Accordingly, for example, when a MISFET microfabricated so as to be smaller than a 28-nm node is formed, certain restraint is provided to the layout rule in order to equalize (uniform) the performances of the formed MISFETs. That is, when the MISFET is microfabricated, it is difficult to accurately form the complex shape due to the issue of the process accuracy of the photolithography technique, and therefore, a rule for simplifying the shapes of the diffusion layer and the gate electrode configuring the MISFET is set to ensure the performance of the microfabricated MISFET. As a specifically-set layout rule, a rule that gate electrodes (polysilicon films) are arranged at the same interval and the gate electrodes have straight-line shapes without being bent at all or a rule that a diffusion layer has a figure shape with eight or less vertexes is provided.

When the layout of the standard cell is designed under a circumstance of the provision of such a new layout rule, the area of the standard cell is adversely large. Hereinafter, this problem will be explained with reference to drawings.

Figure 19:
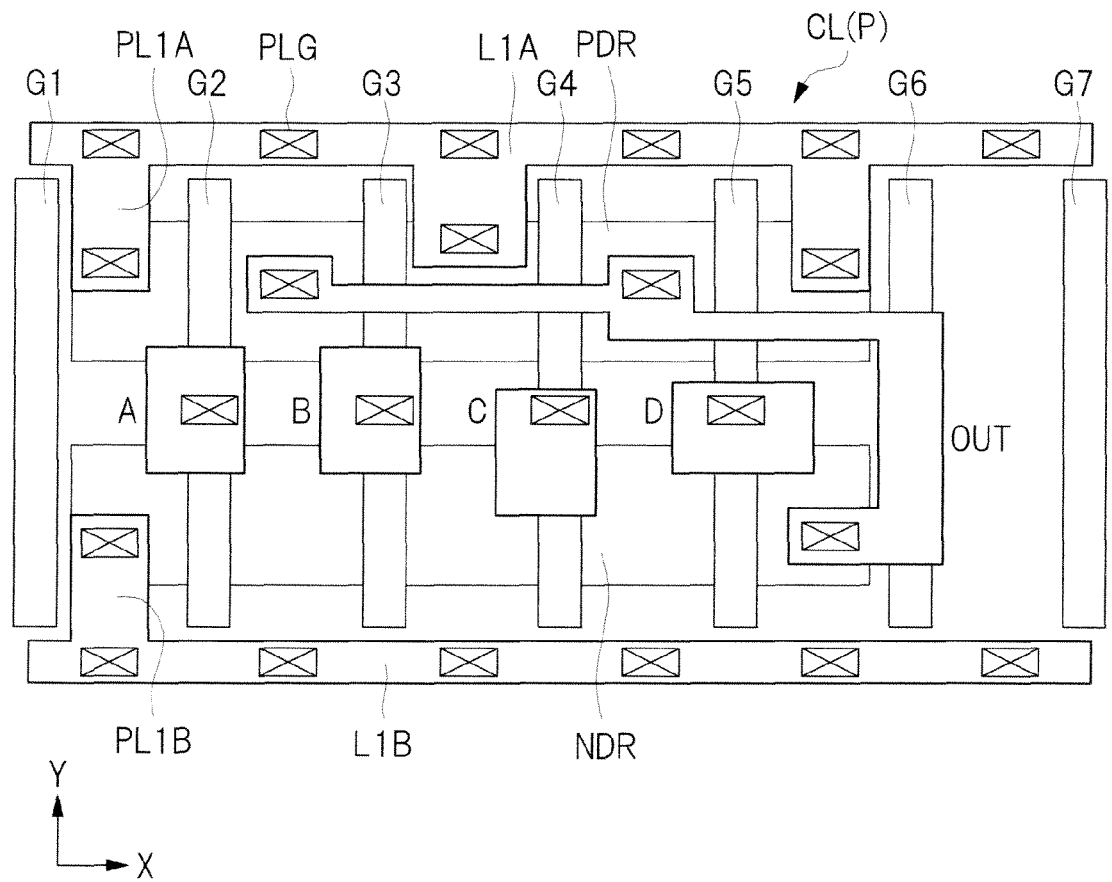
FIG. 19 is a diagram illustrating an example of a layout structure of a standard cell configuring a four-input NAND circuit in a comparative example.

FIG. 19 is a diagram illustrating an example of a layout structure of a standard cell CL(P) configuring a four-input NAND circuit. FIG. 19 illustrates the example of the layout structure in a case that a conventional design method is used and a new layout rule is applied. More specifically, as the new layout rule, a rule that gate electrodes (polysilicon films) are arranged at the same interval and the gate electrodes have straight-line shapes without being bent at all or a rule that a diffusion layer has a figure shape with eight or less vertexes is taken.

As illustrated in FIG. 19, a power supply wiring L1A and a power supply wiring L1B formed in a first wiring layer are arranged so as to sandwich the standard cell CL(P) from above and below and extend in an X direction (first direction). This power supply wiring L1A is a wiring for supplying a power supply potential (VDD), and the power supply wiring L1B is a wiring for supplying a reference potential (GND) lower than the power supply potential (VDD). And, a p-type semiconductor region (p-type diffusion layer) PDR and an n-type semiconductor region (n-type diffusion layer) NDR are formed so as to be sandwiched between the power supply wiring L1A and the power supply wiring L1B. Each of these p-type semiconductor region PDR and n-type semiconductor region NDR has a quadrangular shape based on the new layout rule that the diffusion layer has the figure shape with eight or less vertexes.

For example, the p-type semiconductor region PDR having the quadrangular shape is electrically connected via a plug PLG to the protruding wiring PL1A which protrudes from the power supply wiring L1A in a Y direction (second direction), so that the power supply potential (VDD) is supplied to the p-type semiconductor region PDR from the power supply wiring L1A via the protruding wiring PL1A. Similarly, the n-type semiconductor region NDR having the quadrangular shape is electrically connected via the plug PLG to the protruding wiring PL1B which protrudes from the power supply wiring L1B in the Y direction (second direction), so that the reference potential (GND) is supplied to the n-type semiconductor region NDR from the power supply wiring L1B via the protruding wiring PL1B.

Here, based on the conventional design method, the power supply wiring L1A and the p-type semiconductor region PDR are connected to each other and the power supply wiring L1B and the n-type semiconductor region NDR are connected to each other via the protruding wiring PL1A and the protruding wiring PL1B which are arranged to be connected at the shortest distance, respectively.

Further, as illustrated in FIG. 19, in a region inside the standard cell CL(P) sandwiched by the power supply wiring L1A and the power supply wiring L1B, gate electrodes G1 to G7 are arranged so as to extend in the Y direction (second direction) and line in the X direction (first direction). In this manner, for example, a p-type MISFET is formed in respective regions where the gate electrodes G2 to G5 overlap with the p-type semiconductor region PDR in a plane, and an n-type MISFET is formed in respective regions where the gate electrodes G2 to G5 overlap with the n-type semiconductor region NDR in a plane. These gate electrodes G1 to G7 are formed based on the rule that the gate electrodes (polysilicon films) are arranged at the same interval and the gate electrodes have straight-line shapes without being bent at all.

And, the gate electrode G2 is connected via the plug PLG to an input wiring A formed in the first wiring layer, and the gate electrode G3 is connected via the plug PLG to an input wiring B formed in the first wiring layer. Also, the gate electrode G4 is connected via the plug PLG to an input wiring C formed in the first wiring layer, and the gate electrode G5 is connected via the plug PLG to an input wiring D formed in the first wiring layer. Further, an output wiring OUT is formed so as not to be in contact with the input wirings A to D, and this output wiring OUT is arranged so as to bypass over the gate electrode G6 so as not to be in contact with the input wirings A to D.

In the manner as described above, the standard cell CL(P) configuring the four-input NAND circuit which has been studied by the inventor is formed. Here, although the gate electrode G7 is provided in FIG. 19, it seems that the gate electrode G7 is unnecessary for the standard cell CL(P) configuring the four-input NAND circuit described above. However, if the standard cell CL(P) illustrated in FIG. 19 is configured of the six gate electrodes G1 to G6, the following problem arises. That is, when a plurality of standard cells CL(P) are lined in the X direction (first direction), the output wiring OUT is arranged on a boundary line between adjacent standard cells CL(P) since the output wiring OUT which bypasses over the gate electrode G6 is formed in the standard cell CL(P) illustrated in FIG. 19. As a result, it is thought that the output wiring OUT arranged over the gate electrode G6 is adversely in contact with the first wiring layer on the adjacent standard cells CL(P). In order to suppress the short out of the first wiring layer between the adjacent standard cells CL(P) as described above, the gate electrode G7 is provided outside the gate electrode G6 to ensure a space as illustrated in FIG. 19. In this manner, the short out between the output wiring OUT formed over the gate electrode G6 and the first wiring layer formed in the adjacent standard cell CL(P) can be suppressed. That is, in the standard cell CL(P) illustrated in FIG. 19, it is required to ensure a certain space in order to prevent the short failure between the adjacent standard cells CL(P). Therefore, in the layout structure of the standard cell CL(P) illustrated in FIG. 19, it is found that there is a problem of requiring to ensure a wasteful region for providing the space, which adversely results in increase in a size of the standard cell CL(P).

A cause of this is that the new layout rule is taken with following the conventional design method. More specifically, as illustrated in FIG. 19, based on the conventional design method, the power supply wiring L1A and the p-type semiconductor region PDR are connected to each other and the power supply wiring L1B and the n-type semiconductor region NDR are connected to each other via the protruding wiring PL1A and the protruding wiring PL1B so as to be connected at the shortest distance, respectively. That is, due to the adoption of the conventional design method in which the protruding wiring PL1A for connecting the power supply wiring L1A and the p-type semiconductor region PDR connects between the power supply wiring L1A and the p-type semiconductor region PDR at the shortest distance, when the input wirings A to D are formed, the region where the output wiring OUT is arranged cannot be ensured, and thus, it is required to bypass the output wiring OUT over the gate electrode G6. Therefore, the gate electrode G6 cannot be used as a boundary between the standard cells CL(P), and the gate electrode G7 for ensuring the space is required.

Accordingly, in the first embodiment, a technique is suggested, in which a size of a standard cell can be reduced by taking an innovative design idea completely turned from the conventional design method even if a new layout rule is applied. Hereinafter, an explanation will be made for the technical idea by which the size of the standard cell can be reduced by taking this innovative design idea even if the new layout rule is applied.

Figure 2:
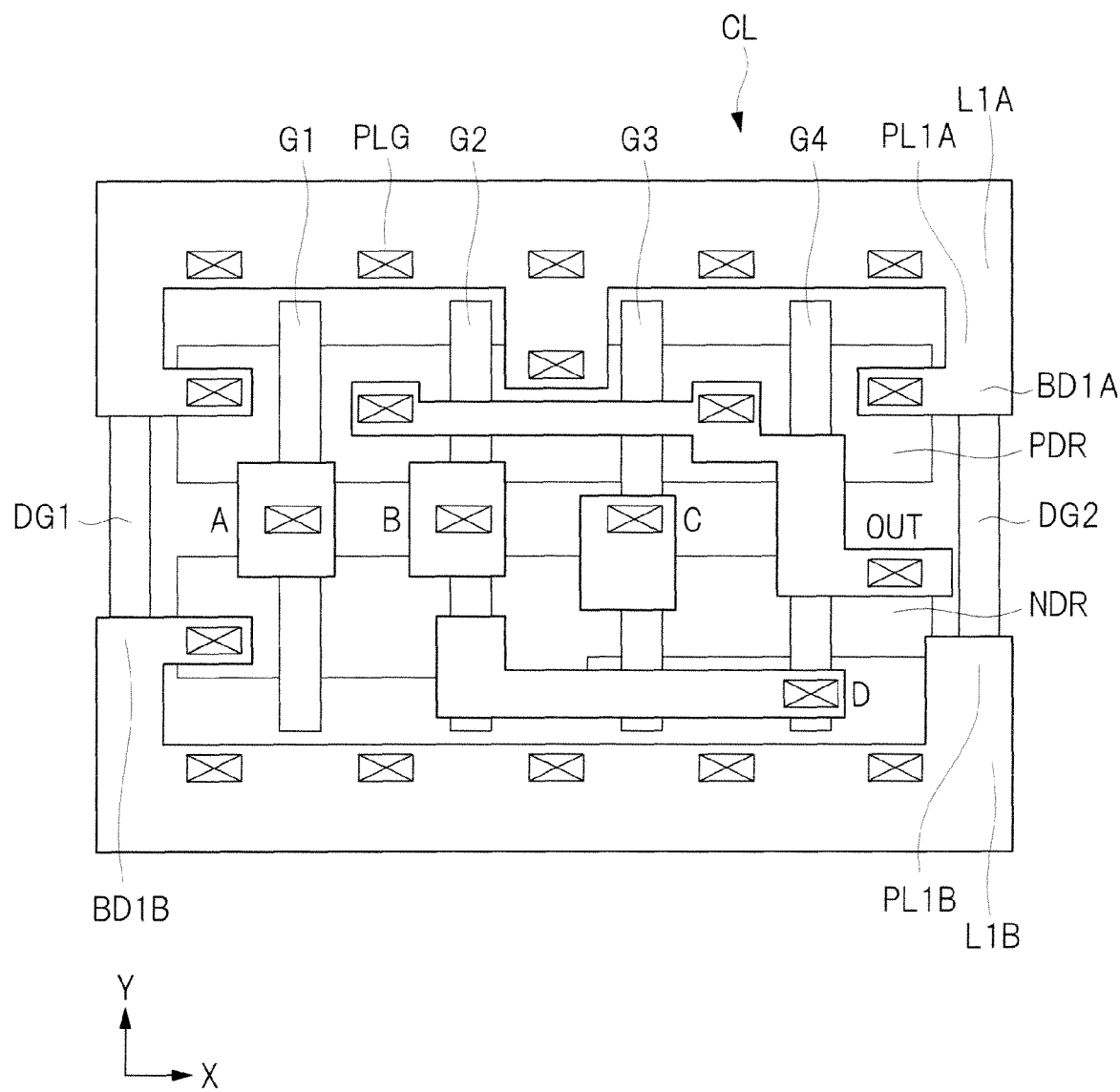
FIG. 2 is a diagram illustrating a layout structure of a standard cell configuring a four-input NAND circuit in the first embodiment.

FIG. 2 is a diagram illustrating a layout structure of a standard cell CL configuring a four-input NAND circuit in the first embodiment. The layout structure of the standard cell CL in the first embodiment takes the innovative design idea different from the conventional design method, and also supports the new layout rule. More specifically, as the new layout rule, a rule that gate electrodes (polysilicon films) are arranged at the same interval and the gate electrodes have straight-line shapes without being bent at all or a rule that a diffusion layer has a figure shape with eight or less vertexes is taken.

As illustrated in FIG. 2, a power supply wiring L1A and a power supply wiring L1B formed in a first wiring layer are arranged so as to extend in an X direction (first direction) and sandwich upper and lower portions of a standard cell (standard power supply horn-like cell, power supply horn-like cell, power horn cell, or horn-power-supply-type standard cell) CL having a rectangular shape. This power supply wiring L1A is a wiring for supplying a power supply potential (VDD), and the power supply wiring L1B is a wiring for supplying a reference potential (GND, VSS) lower than the power supply potential (VDD). And, a p-type semiconductor region (a p-type diffusion layer) PDR and an n-type semiconductor region (an n-type diffusion layer) NDR are formed so as to be sandwiched between the power supply wiring L1A and the power supply wiring L1B. Each of these p-type semiconductor region PDR and n-type semiconductor region NDR has a quadrangular shape based on the new layout rule that the diffusion layer has the figure shape with eight or less vertexes.

The p-type semiconductor region PDR formed in the standard cell CL is arranged so as not to be in contact with both of a first boundary line which connects between one end of a first side (power supply wiring L1A) of the standard cell CL and one end of a second side (power supply wiring L1B) thereof and a second boundary line which connects between the other end of the first side (power supply wiring L1A) and the other end of the second side (power supply wiring L1B). Similarly, the n-type semiconductor region NDR formed in the standard cell CL is arranged so as not to be in contact with both of the first boundary line which connects between one end of the first side (power supply wiring L1A) of the standard cell CL and one end of the second side (power supply wiring L1B) thereof and the second boundary line which connects between the other end of the first side (power supply wiring L1A) and the other end of the second side (power supply wiring L1B). Therefore, in consideration of the plurality of standard cells CL adjacently arranged in the X direction (first direction), the p-type semiconductor region PDR formed in each of the standard cells CL is isolated from the other p-type semiconductor region, and the n-type semiconductor region NDR formed in each of the standard cells CL is also isolated from the other n-type semiconductor region.

Next, in the standard cell CL in the first embodiment, two protruding wirings PL1A are formed so as to branch from the power supply wiring L1A at both ends of the standard cell CL (at a boundary between the standard cells CL) and to protrude in the Y direction (second direction) toward an inside of the standard cell CL. Similarly, two protruding wirings (horn-like power supply wirings, horn power supply wirings, horn wirings) PL1B are formed so as to branch from the power supply wiring L1B at both ends of the standard cell CL (at a boundary between the standard cells CL) and to protrude in the Y direction (second direction) toward the inside of the standard cell CL. And, at least one or more protruding wirings extracted from the protruding wirings PL1A and the protruding wirings PL1B include a bent portion whose end is bent in the X direction (first direction) toward the inside of the standard cell CL. More specifically, when the protruding wiring including the bent portion formed therein branches from the power supply wiring L1A (in the case of the protruding wiring PL1A), the protruding wiring PL1A is electrically connected to the p-type semiconductor region PDR via a plug PLG connected to a bent portion BD1A. On the other hand, when the protruding wiring including the bent portion formed therein branches from the power supply wiring L1B (in the case of the protruding wiring PL1B), the protruding wiring PL1B is electrically connected to the n-type semiconductor region NDR via a plug PLG connected to a bent portion BD1B.

Next, as illustrated in FIG. 2, in a region inside the standard cell CL sandwiched by the power supply wiring L1A and the power supply wiring L1B, a dummy gate electrode DG1, gate electrodes G1 to G4, and a dummy gate electrode DG2 are arranged so as to extend in the Y direction (second direction) and line in the X direction (first direction). In this manner, for example, a p-type MISFET is formed in respective regions where the gate electrodes G1 to G4 overlap with the p-type semiconductor region PDR in a plane, and an n-type MISFET is formed in respective regions where the gate electrodes G1 to G4 overlap with the n-type semiconductor region NDR in a plane. These gate electrodes G1 to G4 and dummy gate electrodes DG1 and DG2 are formed based on the rule that the gate electrodes (polysilicon films) are arranged at the same interval and the gate electrodes have straight-line shapes without being bent at all. The dummy gate electrodes DG1 and DG2 described here do not overlap with the p-type semiconductor region PDR and the n-type semiconductor region NDR in a plane, and are arranged on a boundary line between the standard cells CL. In other words, the dummy gate electrodes DG1 and DG2 do not function as the gate electrodes of the p-type MISFET and the n-type MISFET, and their potentials are in a floating state.

And, the gate electrode G1 is connected to an input wiring A formed in a first wiring layer via the plug PLG, and the gate electrode G2 is connected to an input wiring B formed from the first wiring layer via the plug PLG. Also, the gate electrode G3 is connected to an input wiring C formed from the first wiring layer via the plug PLG, and the gate electrode G4 is connected to an input wiring D formed from the first wiring layer via the plug PLG. And, an output wiring OUT is formed so as not to be in contact with the input wirings A to D, and this output wiring OUT is arranged over the gate electrode G4 so as not to be in contact with the input wirings A to D.

The above-described standard cell CL is configured of components formed in and lower than the first wiring layer, and the input wirings A to D for inputting an input signal to the standard cell CL and the output wiring OUT which is formed in the first wiring layer for outputting an output signal from the standard cell CL are electrically connected to a wiring in an upper layer (second wiring layer) than the first wiring layer. That is, in the first embodiment, the standard cell CL is configured of components in and lower than the first wiring layer, and this standard cell CL is connected in the second wiring layer which is the upper layer than the first wiring layer, so that a digital circuit (logic circuit) can be formed.

Note that an n-type power feeding region (semiconductor region) for supplying the power supply potential (VDD) to an n-type well is provided right below the power supply wiring L1A, and this n-type power feeding region and the power supply wiring L1A are connected to each other via a plug PLG. Similarly, a p-type power feeding region (semiconductor region) for supplying the reference potential (GND) to a p-type well is provided right below the power supply wiring L1B, and this p-type power feeding region and the power supply wiring L1B are connected to each other via a plug PLG. That is, an N-type well is formed in a semiconductor substrate where the standard cell CL is formed, and the power supply wiring L1A and the N-type well are electrically connected to each other via a plurality of plugs PLG (first via plugs). Similarly, a P-type well is formed in the semiconductor substrate where the standard cell CL is formed, and the power supply wiring L1B and the P-type well are electrically connected to each other via a plurality of plugs (second via plugs). Here, the plurality of plugs PLG (first via plugs and second via plugs) are not formed at four corners of the standard cell CL.

In the above-described manner, the standard cell CL configuring the four-input NAND circuit in the first embodiment is formed. Here, as illustrated in FIG. 2, the first embodiment has a characteristic that, for example, the protruding wiring PL1A protrudes from the power supply wiring L1A at each corner of both ends of the standard cell CL toward the inside of the standard cell CL (in the Y direction), and besides, the bent portion BD1A is formed so as to be bent from the protruding wiring PL1A in the X direction. And, the characteristic is that these bent portion BD1A and the p-type semiconductor region PDR are connected to each other via the plug PLG. That is, the first embodiment has a characteristic in the layout structure that the power supply wiring L1A and the p-type semiconductor region PDR are connected to each other.

For example, as illustrated in FIG. 19, when the conventional design method is used, the power supply wiring L1A and the p-type semiconductor region PDR are connected to each other and the power supply wiring L1B and the n-type semiconductor region NDR are connected to each other via the protruding wiring PL1A and the protruding wiring PL1B so as to be connected at the shortest distance, respectively. That is, due to the adoption of the conventional design method in which the protruding wiring PL1A for connecting between the power supply wiring L1A and the p-type semiconductor region PDR is formed so as to connect between the power supply wiring L1A and the p-type semiconductor region PDR at the shortest distance, when the input wirings A to D are formed, the region where the output wiring OUT is arranged cannot be ensured, and thus, it is required to bypass the output wiring OUT over the gate electrode G6. Therefore, the gate electrode G6 cannot be used as a boundary between the standard cells CL(P), and the gate electrode G7 for ensuring the space is required.

On the other hand, in the first embodiment illustrated in FIG. 2, an innovative design method different from the conventional design method is used. More specifically, as illustrated in FIG. 2, as a method of connecting between the power supply wiring L1A and the p-type semiconductor region PDR, the protruding wiring PL1A is first drawn out from the power supply wiring L1A at the corner of the standard cell CL instead of arranging the protruding wiring PL1A so as to connect between the power supply wiring L1A and the p-type semiconductor region PDR at the shortest distance. Then, the bent portion BD1A is provided to this drawn-out protruding wiring PL1A, so that the plug PLG connected to the p-type semiconductor region PDR is formed at the bent portion BD1A. In this case, the connection between the power supply wiring L1A and the p-type semiconductor region PDR is not formed at the shortest distance, and therefore, the size of the standard cell CL seems to be apparently increased. However, by the layout structure in which the protruding wiring PL1A is drawn out from the corner of the power supply wiring L1A and then the bent portion BD1A is provided to the protruding wiring PL1A, the protruding wiring PL1A is formed at the corner of the standard cell CL, so that the number of the protruding wirings PL1A to be formed inside the standard cell CL can be reduced. This means the increase in the space provided inside the standard cell CL, and the degree of flexibility of the layout structure is improved by effectively using this space.

While the protruding wiring PL1A which protrudes from the power supply wiring L1A is described here, the same goes for the protruding wiring PL1B which protrudes from the power supply wiring L1B. That is, as illustrated in FIG. 2, as a method of connecting between the power supply wiring L1B and the n-type semiconductor region NDR, the protruding wiring PL1B is first drawn out from the power supply wiring L1B at the corner of the standard cell CL instead of arranging the protruding wiring PL1B so as to connect between the power supply wiring L1B and the n-type semiconductor region NDR at the shortest distance. Then, the bent portion BD1B is provided to this drawn-out protruding wiring PL1B, so that the plug PLG connected to the n-type semiconductor region NDR is formed at the bent portion BD1B. In this case, the connection between the power supply wiring L1B and the n-type semiconductor region NDR is not formed at the shortest distance, and therefore, the size of the standard cell CL seems to be apparently increased. However, by the layout structure in which the protruding wiring PL1B is drawn out from the corner of the power supply wiring L1B and then the bent portion BD1B is provided to the protruding wiring PL1B, the protruding wiring PL1B is formed at the corner of the standard cell CL, so that the number of the protruding wirings PL1B to be formed inside the standard cell CL can be reduced. This means the increase in the space provided inside the standard cell CL, and the degree of flexibility of the layout structure is improved by effectively using this space.

More specifically, as illustrated in FIG. 2, the layout is structured so that the protruding wiring PL1A and the protruding wiring PL1B are arranged at corners of the standard cell CL (on the boundary lines therebetween), and that the bent portion BD1A is provided to this protruding wiring PL1A and the bent portion BD1B is provided to this protruding wiring PL1B. Accordingly, the number of the protruding wirings PL1A and the protruding wirings PL1B to be formed in an inner region of the standard cell CL can be reduced. As a result, the space can be ensured in the inner region of the standard cell CL, and the degree of flexibility of the layout structure can be improved. For example, as illustrated in FIG. 2, the arrangement position of the output wiring OUT can be ensured on the gate electrode G4 by contriving the arrangement position of the input wiring D based on the improvement of the degree of flexibility of the layout structure. Therefore, the layout can be structured so that four input wirings A to D and one output wiring OUT of the four-input NAND circuit are on four gate electrodes G1 to G4. Therefore, in the standard cell CL of the four-input NAND circuit in the first embodiment, the standard cell CL can be configured of six electrodes obtained by combining the dummy gate electrodes DG1 and DG2 and the gate electrodes G1 to G4. That is, while the standard cell CL is configured of seven gate electrodes in the comparative example illustrated in FIG. 19, the standard cell CL can be configured of six electrodes in the first embodiment illustrated in FIG. 2, and therefore, an effect capable of reducing the size of the standard cell CL can be obtained. That is, as illustrated in FIG. 2, the first embodiment adopts the innovative design method of the layout structure in which the protruding wiring PL1A and the protruding wiring PL1B are arranged at the corners of the standard cell CL (on the boundary lines therebetween) and in which the bent portion BD1A is provided to this protruding wiring PL1A and the bent portion BD1B is provided to this protruding wiring PL1B, as not seen in the conventional design method. Therefore, a significant effect capable of reducing the size of the standard cell CL can be obtained even in the application of the new layout rule introduced in accordance with the microfabrication of the MISFET.

Note that, in the first embodiment, the four-input NAND circuit is cited as the example of the standard cell CL, and the bent portion BD1A is provided to each of the protruding wirings PL1A formed at both corners of the power supply wiring L1A. On the other hand, while the protruding wirings PL1B are also formed at both corners of the power supply wiring L1B, the bent portion BD1B is formed on only a left side of the protruding wiring PL1B in FIG. 2, and the bent portion BD1B is not formed on a right side of the protruding wiring PL1B in FIG. 2. That is, in the four-input NAND circuit in the first embodiment, the bent portions (BD1A and BD1B) are provided to three protruding wirings (PL1A and PL1B) among four protruding wirings (PL1A and PL1B). However, the technical idea in the first embodiment is not limited to this, and the bent portions (BD1A and BD1B) may be provided to two protruding wirings (PL1A and PL1B) among four protruding wirings (PL1A and PL1B), and further, the bent portions (BD1A, BD1B) may be provided to at least one protruding wiring (PL1A or PL1B) in some cases depending on the standard cell CL. That is, on an assumption that the protruding wirings (PL1A and PL1B) are provided at four corners of the standard cell CL, the technical idea of the first embodiment can be applied to the case that the bent portion (BD1A or BD1B) is provided to at least one or more protruding wirings (PL1A or PL1B) among these four protruding wirings (PL1A and PL1B).

Also, in the first embodiment, each of the plurality of standard cells CL may be configured so that the protruding wiring PL1A which branches from the power supply wiring L1A at a location other than the both ends of one standard cell CL on the first side (power supply wiring L1A) and which protrudes toward the inside of the standard cell CL in the Y direction is provided, and that this protruding wiring PL1A is electrically connected to the p-type semiconductor region PDR via the plug PLG. Similarly, in the first embodiment, each of the plurality of standard cells CL may be configured so that the protruding wiring PL1B which branches from the power supply wiring L1B at also a location other than the both ends of one standard cell CL on the second side (power supply wiring L1B) and which protrudes toward the inside of the standard cell CL in the Y direction is provided, and that this protruding wiring PL1B is electrically connected to the n-type semiconductor region NDR via the plug PLG. That is, in the first embodiment, the protruding wirings (PL1A and PL1B) which protrude from four corners of the standard cell CL in the Y direction are provided, and the bent portions (BD1A and BD1B) which are bent from the protruding wirings (PL1A and PL1B) in the X direction are formed. And, there is the characteristic that these bent portions (BD1A and BD1B) and the p-type semiconductor region PDR and the n-type semiconductor region NDR are connected to each other via the plugs PLG, and there may be a structure on the assumption of taking such a characteristic structure, in which the protruding wirings (PL1A and PL1B) are provided at a location other than those described above and are connected to the n-type semiconductor region NDR and the p-type semiconductor region PDR via the plugs PLG. Even in this case, compared with the case that all protruding wirings (PL1A and PL1B) are formed inside the standard cell CL, the number of the protruding wirings PL1A and the protruding wirings PL1B formed in the inner region of the standard cell CL can be reduced. As a result, the space can be ensured in the inner region of the standard cell CL, and the degree of flexibility of the layout structure can be improved. Therefore, even in the case of the application of the new layout rule introduced in accordance with the microfabrication of the MISFET, the size of the standard cell CL can be reduced.

Also, a further characteristic of the first embodiment is that a minimum line width of the protruding wiring PL1A and a minimum line width of the protruding wiring PL1B are smaller than a line width of the power supply wiring L1A or a line width of the power supply wiring L1B. For example, since the protruding wiring PL1A and the protruding wiring PL1B configure wirings for supplying the power supply potential and the reference potential to the p-type semiconductor region PDR and the n-type semiconductor region NDR, it seems that the line widths are desirably thick in order to stabilize the potential and suppress migration of the wirings. Surely, this is certain when the power supply potential is high such as 5 V. However, a semiconductor device targeted by the first embodiment is, for example, the one which is microfabricated to be smaller than a 28-nm node. In such a microfabricated semiconductor device, the power supply potential is also lower than that of the scaling law. For example, the power supply potential is lowered to be about 1 V. In the case of such a low voltage, the migration of wirings is relatively not a problem, and therefore, it is not required that the line widths of the protruding wiring PL1A and the protruding wiring PL1B are formed as thick as the line widths of the power supply wiring L1A and the power supply wiring L1B. That is, in the first embodiment, the minimum line width of the protruding wiring PL1A and the minimum line width of the protruding wiring PL1B are smaller than the line width of the power supply wiring L1A or the power supply wiring L1B. In this manner, an area occupied by the protruding wirings PL1A and the protruding wirings PL1B formed at four corners of the standard cell CL can be decreased. As a result, a ratio of the protruding wiring PL1A and the protruding wiring PL1B occupied in the standard cell CL can be decreased. From this, in the first embodiment, the space can be ensured in the inner region of the standard cell CL, and the degree of flexibility of the layout structure can be improved. Therefore, the degree of flexibility of contriving the layout structure can be increased even in the case of application of the new layout rule introduced in accordance with the microfabrication of the MISFET, and therefore, the layout structure in which the size of the standard cell CL can be reduced can be easily adopted.

On the other hand, the minimum line widths of the protruding wiring PL1A and the protruding wiring PL1B are larger than line widths of the gate electrodes G1 to G4 and the dummy gate electrodes DG1 and DG2. In other words, the line widths of the gate electrodes G1 to G4 and the dummy gate electrodes DG1 and DG2 are smaller than the minimum line widths of the protruding wiring PL1A and the protruding wiring PL1B. This is because the most microfabricated components among the components of the standard cell CL are the gate electrodes G1 to G4 (including the dummy gate electrodes DG1 and DG2) and because the protruding wiring PL1A and the protruding wiring PL1B are formed by processing the first wiring layer whose process accuracy is lower than those of the gate electrodes G1 to G4 (and the dummy gate electrodes DG1 and DG2).

As described above, the characteristic of the first embodiment is that the protruding wirings (PL1A and PL1B) protrude from the power supply wirings (L1A and L1B) at the corners of both ends of the standard cell CL toward the inside of the standard cell CL (in the Y direction) and that the bent portions (BD1A and BD1B) which are bent from the protruding wirings (PL1A and PL1B) in the X direction are formed. And, these bent portions (BD1A and BD1B) and the p-type semiconductor region PDR and the n-type semiconductor region NDR are connected to each other via the plugs PLG. In this manner, the space can be ensured in the inner region of the standard cell CL, and the degree of flexibility of the layout structure can be improved. Therefore, the degree of flexibility of contriving the layout structure is increased even in the case of application of the new layout rule introduced in accordance with the microfabrication of the MISFET, so that the layout structure capable of reducing the size of the standard cell CL can be easily adopted. In this characteristic structure, the size of each standard cell is reduced with focusing on one standard cell. Further, in the characteristic structure described above, the size can be reduced also in a viewpoint of focusing on the plurality of adjacent standard cells.

Figure 20:
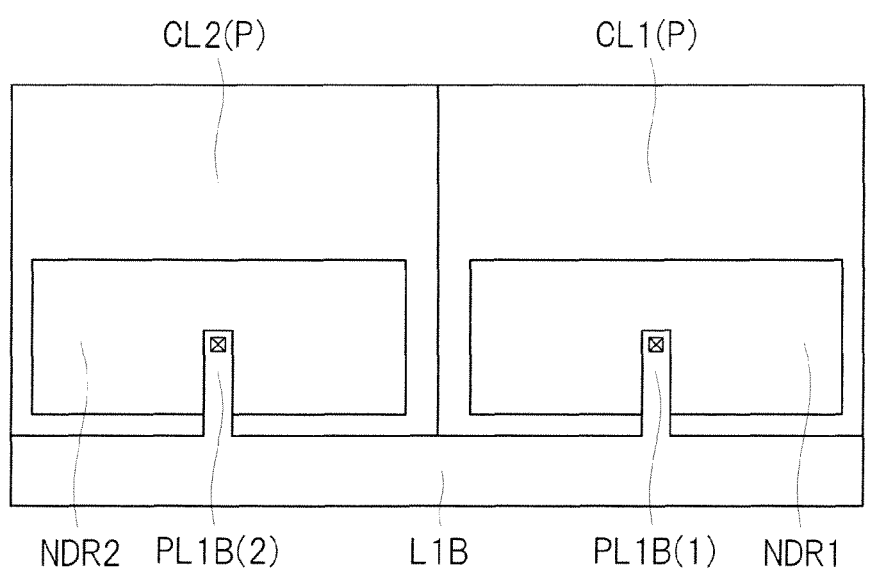
FIG. 20 is a diagram illustrating a comparative example using a conventional design method, which is a diagram illustrating two adjacent standard cells.

Hereinafter, this will be explained. FIG. 20 is a diagram illustrating a comparative example using the conventional design method. More specifically, FIG. 20 illustrates two adjacent standard cells CL1(P) and CL2(P). In FIG. 20, a protruding wiring PL1B(1) connected from the power supply wiring L1B to an n-type semiconductor region NDR1 at the shortest distance is formed the standard cell CL1(P), and a protruding wiring PL1B(2) connected from the power supply wiring L1B to an n-type semiconductor region NDR2 at the shortest distance is formed in the standard cell CL2(P) Therefore, it is required to form the protruding wiring PL1B(1) and the protruding wiring PL1B(2) for the two standard cells CL1(P) and CL2(P), respectively. Therefore, in the two standard cells CL1(P) and CL2(P), the two protruding wirings PL1B(1) and PL1B(2) are required.

Figure 3:
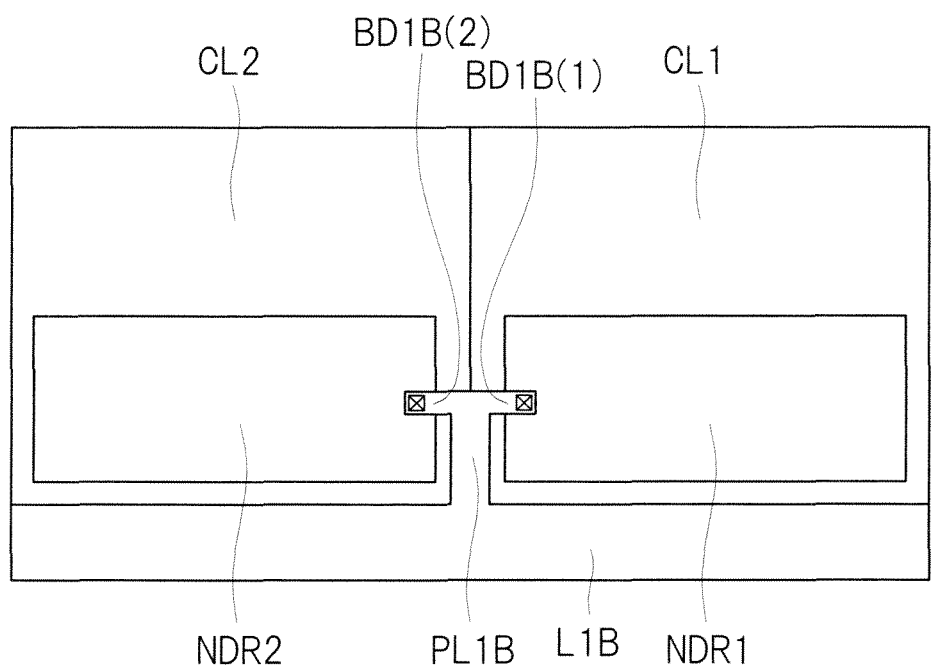
FIG. 3 is a diagram illustrating adjacent standard cells in the first embodiment.

On the other hand, FIG. 3 is a diagram illustrating the adjacent standard cells CL1 and CL2 in the first embodiment. As illustrated in FIG. 3, in the first embodiment, the protruding wiring PL1B is formed on the boundary line between the adjacent standard cells CL1 and CL2, and the bent portion BD1B(1) which is bent rightward from this protruding wiring PL1B and the bent portion BD1B(2) which is bent leftward therefrom are formed. And, the bent portion BD1B(1) is connected to an n-type semiconductor region NDR1 of a standard cell CL1 via a plug, and the bent portion BD1B(2) is connected to an n-type semiconductor region NDR2 of a standard cell CL2 via a plug. Therefore, in the first embodiment illustrated in FIG. 3, by one protruding wiring PL1B shared between the two adjacent standard cells CL1 and CL2, the reference potential (GND) can be supplied to each of the standard cells CL1 and CL2.

That is, in the comparative example illustrated in FIG. 20, for the two adjacent standard cells CL1(P) and CL2(P), two protruding wirings (BD1B(1) and BD1B(2)) for connecting between the power supply wiring L1B and the n-type semiconductor regions (NDR1 and NDR2) at the shortest distance are required. On the other hand, in the first embodiment illustrated in FIG. 3, for the two adjacent standard cells CL1 and CL2, by only one protruding wiring PL1B, the reference potential (GND) can be supplied to both of the standard cells CL1 and CL2. This means that the number of protruding wirings drawn out from the power supply wiring L1B can be reduced in the first embodiment illustrated in FIG. 3 more than the comparative example illustrated in FIG. 20. Therefore, in the first embodiment illustrated in FIG. 3, since the number of protruding wirings PL1B formed inside the standard cell CL1 and the standard cell CL can be reduced, a sufficient space can be ensured in the inner region of the standard cell CL1 and the standard cell CL2, and the degree of flexibility of the layout structure can be improved. From this, the degree of flexibility of contriving the layout structure is increased even in the case of application of the new layout rule introduced in accordance with the microfabrication of the MISFET, so that the layout structure capable of reducing the size of the standard cell CL can be easily adopted.

Second Embodiment

While the four-input NAND circuit has been explained as the example of the standard cell in the first embodiment described above, an example of application of a technical idea in the present invention to an inverter circuit will be explained in a second embodiment.

FIG. 4A is a circuit diagram illustrating two inverter circuits parallely connected between an input wiring IN and an output wiring OUT, and FIG. 4B is a plan view illustrating an example of a layout structure of the inverter circuits illustrated in FIG. 4A. In FIG. 4A, a first inverter includes a p-type MISFET (P1) and an n-type MISFET (N1), and the p-type MISFET (P1) and the n-type MISFET (N1) are connected in series between a power supply potential (VDD) and a reference potential (GND). Similarly, a second inverter includes a p-type MISFET (P2) and an n-type MISFET (N2), and the p-type MISFET (P2) and the n-type MISFET (N2) are connected in series between the power supply potential (VDD) and the reference potential (GND). And, the input wiring IN is connected to both gate electrodes of the p-type MISFET (P1) and the n-type MISFET (N1) and also both gate electrodes of the p-type MISFET (P2) and the n-type MISFET (N2). On the other hand, the output wiring OUT is connected to a drain region between the p-type MISFET (P1) and the n-type MISFET (N1) and also a drain region between the p-type MISFET (P2) and the n-type MISFET (N2). According to the configured inverter circuits as described above, a signal in reverse to a signal inputted to the input wiring IN is outputted from the output wiring OUT. For example, when a signal "0" is inputted to the input wiring IN, a signal "1" is outputted from the output wiring OUT. Conversely, when a signal "1" is inputted to the input wiring IN, a signal "0" is outputted from the output wiring OUT.

Next, FIG. 4B is a plan view illustrating an example of a layout structure of the inverter circuits illustrated in the circuit diagram of FIG. 4A. In FIG. 4B, the layout structure of the standard cell CL in the second embodiment takes an innovative design idea different from the conventional design method, and also supports a new layout rule. More specifically, as the new layout rule, a rule that gate electrodes (polysilicon films) are arranged at the same interval and the gate electrodes have straight-line shapes without being bent at all or a rule that a diffusion layer has a figure shape with eight or less vertexes is taken.

As illustrated in FIG. 4B, a power supply wiring L1A and a power supply wiring L1B formed in a first wiring layer are arranged so as to sandwich the standard cell CL having a rectangular shape from above and below and extend in an X direction (first direction). This power supply wiring L1A is a wiring for supplying the power supply potential (VDD), and the power supply wiring L1B is a wiring for supplying the reference potential (GND) lower than the power supply potential (VDD). And, a p-type semiconductor region (p-type diffusion layer) PDR and an n-type semiconductor region (n-type diffusion layer) NDR are formed so as to be sandwiched between the power supply wiring L1A and the power supply wiring LIB. Each of these p-type semiconductor region PDR and n-type semiconductor region NDR has a quadrangular shape based on the new layout rule that the diffusion layer has the figure shape with eight or less vertexes.

The p-type semiconductor region PDR formed in the standard cell CL is arranged so as not to be in contact with a first boundary line which connects between one end of a first side (power supply wiring L1A) and one end of a second side (power supply wiring L1B) of the standard cell CL and a second boundary line which connects between the other end of the first side (power supply wiring L1A) and the other end of the second side (power supply wiring L1B). Similarly, the n-type semiconductor region NDR formed in the standard cell CL is arranged so as not to be in contact with the first boundary line which connects between one end of the first side (power supply wiring L1A) and one end of the second side (power supply wiring LIB) of the standard cell CL and the second boundary line which connects between the other end of the first side (power supply wiring L1A) and the other end of the second side (power supply wiring L1B). Therefore, in consideration of a plurality of standard cells CL adjacently arranged in the X direction (first direction), the p-type semiconductor region PDR formed in each of the standard cells CL is isolated from the other p-type semiconductor region, and the n-type semiconductor region NDR formed in each of the standard cells CL is also isolated from the other n-type semiconductor region.

Subsequently, in the standard cell CL in the second embodiment, two protruding wirings PL1A are formed so as to branch from the power supply wiring L1A at both ends of the standard cell CL (a boundary between the standard cells CL) and to protrude in the Y direction (second direction) toward an inside of the standard cell CL. Similarly, two protruding wirings PL1B are formed so as to branch from the power supply wiring L1B at both ends of the standard cell CL (a boundary between the standard cells CL) and to protrude in the Y direction (second direction) toward the inside of the standard cell CL. And, each of the two protruding wirings PL1A includes a bent portion BD1A whose end is bent in the X direction (first direction) toward the inside of the standard cell CL. This bent portion BD1A is electrically connected to the p-type semiconductor region PDR via a plug PLG. On the other hand, each of the two protruding wirings PL1B includes a bent portion BD1B whose end is bent in the X direction (first direction) toward the inside of the standard cell CL, and further includes a bent portion BD2B in the bent portion BD1B whose end is bent in the Y direction (second direction). This bent portion BD2B is electrically connected to the n-type semiconductor region NDR via a plug PLG.

As described above, in the second embodiment, the protruding wiring PL1B including the bent portion BD1B formed therein further includes the bent portion BD2B which is bent from the end of the bent portion BD1B in the Y direction (second direction), and this bent portion BD2B is electrically connected to the n-type semiconductor region NDR via the plug PLG.

Note that, while the layout is structured so that each of the protruding wirings PL1A includes the bent portion BD1A and each of the protruding wirings PL1B includes the bent portion BD1B and the bent portion BD2B in the second embodiment, the layout may be structured so that the protruding wiring PL1A including the bent portion BD1A formed therein further includes an additional bent portion which is bent from an end of the bent portion BD1A in the Y direction (second direction). In this case, the protruding wiring PL1A including the bent portion BD1A and the additional bent portion formed therein is electrically connected to the p-type semiconductor region PDR via a plug PLG connected to the additional bent portion.

Next, as illustrated in FIG. 4B, in a region inside the standard cell CL sandwiched by the power supply wiring L1A and the power supply wiring L1B, a dummy gate electrode DG1, gate electrodes G1 and G2, and a dummy gate electrode DG2 are arranged so as to extend in the Y direction (second direction) and line in the X direction (first direction). In this manner, for example, p-type MISFETs (P1) and (P2) are formed in respective regions where the gate electrodes G1 and G2 overlap with the p-type semiconductor region PDR in a plane, and n-type MISFETs (N1) and (N2) are formed in respective regions where the gate electrodes G1 and G2 overlap with the n-type semiconductor region NDR in a plane. These gate electrodes G1 and G2 and dummy gate electrodes DG1 and DG2 are formed based on the rule that the gate electrodes (polysilicon films) are arranged at the same interval and the gate electrodes have straight-line shapes without being bent at all. The dummy gate electrodes DG1 and DG2 described here do not overlap with the p-type semiconductor region PDR and the n-type semiconductor region NDR in a plane, and are arranged on a boundary line between the standard cells CL. In other words, the dummy gate electrodes DG1 and DG2 do not function as the gate electrodes of the p-type MISFETs (P1 and P2) and the n-type MISFETs (N1 and N2), and their potentials are in a floating state.

Also, by arranging the dummy gate electrodes DG1 and DG2 on both ends of the standard cell CL and uniformly arranging the gate electrodes DG1 and DG2 therein, the dummy gate electrodes and the gate electrodes are arranged at a constant interval (substantially the same interval) on a chip where the standard cells are continuously arranged, so that flatness in polishing by CMP (Chemical Mechanical Polishing) can be ensured. That is, an interlayer insulating film is formed in an upper layer which covers the dummy gate electrodes and the gate electrodes. After this interlayer insulating film is formed, CMP polishing is performed for a surface of the interlayer insulating film in order to flatten the surface of the interlayer insulating film. Here, when the dummy gate electrodes DG1 and DG2 are not arranged on both ends of the standard cell CL, the gate electrodes are not arranged at the same interval in a lower layer of the interlayer insulating film. Therefore, when the CMP polishing is performed for the interlayer insulating film, there is a risk that the flatness may be decreased due to unevenness of a base. However, in the second embodiment, the dummy gate electrodes DG1 and DG2 are formed, so that the dummy gate electrodes DG1 and DG2 and the gate electrodes are arranged at the same interval. As a result, when the CMP polishing is performed for the interlayer insulating film formed in the upper layer, the flatness of the interlayer insulating film can be sufficiently ensured, and a highly-reliable wiring layer can be formed.

And, the gate electrode G1 is connected to an input wiring IN formed in a first wiring layer via a plug PLG. And, an output wiring OUT is formed so as not to be in contact with the input wiring IN, and this output wiring OUT is arranged over the gate electrode G2 so as not to be in contact with the input wiring IN.

The above-described standard cell CL is configured of components formed in and lower than the first wiring layer, and the input wiring IN for inputting an input signal to the standard cell CL and the output wiring OUT which is formed in the first wiring layer for outputting an output signal from the standard cell CL are electrically connected to a wiring in an upper layer (second wiring layer) than the first wiring layer. That is, in the second embodiment, the standard cell CL is configured of components in and lower than the first wiring layer, and this standard cell CL is connected in the second wiring layer which is the upper layer than the first wiring layer, so that a digital circuit (logic circuit) can be formed.

Note that an n-type power feeding region (semiconductor region) for supplying the power supply potential (VDD) to an n-type well is provided right below the power supply wiring L1A, and this n-type power feeding region and the power supply wiring L1A are connected to each other via a plug PLG. Similarly, a p-type power feeding region (semiconductor region) for supplying the reference potential (GND) to a p-type well is provided right below the power supply wiring L1B, and this p-type power feeding region and the power supply wiring L1B are connected to each other via a plug PLG. That is, an N-type well is formed in a semiconductor substrate where the standard cell CL is formed, and the power supply wiring L1A and the N-type well are electrically connected to each other via a plurality of plugs PLG (first via plugs). Similarly, a P-type well is formed in the semiconductor substrate where the standard cell CL is formed, and the power supply wiring L1B and the P-type well are electrically connected to each other via a plurality of plugs (second via plugs). Here, the plurality of plugs PLG (first via plugs and second via plugs) are not formed at four corners of the standard cell CL.

Subsequently, the layout structure of the inverter circuits illustrated in FIG. 4B is dissolved into respective layers as illustrated in FIGS. 5A to 5D. FIG. 5A is a diagram illustrating the semiconductor substrate which is the lowermost layer. As illustrated in FIG. 5A, on the semiconductor substrate, an n-type power feeding region DR1, the p-type semiconductor region PDR, the n-type semiconductor region NDR, and a p-type power feeding region DR2 are formed so as to line in the Y direction. All regions illustrated in FIG. 5A are formed of a semiconductor region.

Next, FIG. 5B is a diagram illustrating a structure formed in an upper layer than FIG. 5A. As illustrated in FIG. 5B, a dummy gate electrode DG1, gate electrodes G1 and G2, and a dummy gate electrode DG2 are arranged so as to extend in the Y direction and line in the X direction. These dummy gate electrodes DG1 and DG2 and gate electrodes G1 and G2 are formed by processing a polysilicon film.

And, FIG. 5C is a diagram illustrating plugs PLG formed in an upper layer than FIGS. 5A and 5B. Further, FIG. 5D is a diagram illustrating the first wiring layer formed in an upper layer than FIGS. 5A to 5C. More specifically, as the first wiring layer, the power supply wiring L1A, the power supply wiring L1B, the protruding wiring PL1A, the protruding wiring PL1B, the bent portion BD1A, the bent portion BD1B, the bent portion BD2B, a wiring L1C, the input wiring IN, and the output wiring OUT are formed therein.

As described above, in the second embodiment, the protruding wirings (PL1A and PL1B) protrude from the power supply wirings (L1A and L1B) at corners of both ends of the standard cell CL toward an inside of the standard cell CL (in the Y direction), the bent portions (BD1A and BD1B) which are bent from the protruding wirings (PL1A and PL1B) in the X direction are formed, and further, the bent portion BD2B which is bent from the bent portion BD1B in the Y direction is formed. And, these bent portions (BD1A and BD2B) and the p-type semiconductor region PDR and the n-type semiconductor region NDR are connected to each other via the plugs PLG. In this manner, a space can be ensured in the inner region of the standard cell CL, and the degree of flexibility of the layout structure can be improved. Therefore, the degree of flexibility of contriving the layout structure can be increased even in the case of application of the new layout rule introduced in accordance with the microfabrication of the MISFET, so that the layout structure capable of reducing the size of the standard cell CL can be easily adopted.

Here, a further advantage in the second embodiment will be explained. In the second embodiment, for example, as illustrated in FIG. 4B, the gate electrode G1 and the gate electrode G2 are electrically connected to each other via the wiring L1C formed in the first wiring layer. This is because of taking the new layout rule that the gate electrodes (polysilicon films) are arranged at the same interval and the gate electrodes have straight-line shapes without being bent at all. That is, if there is no new layout rule described above, the gate electrode G1 and the gate electrode G2 can be connected to each other by providing a bent portion obtained by processing the polysilicon film in the gate electrode G1 and the gate electrode G2 each formed of the polysilicon film. However, if the new layout rule described above is set, the gate electrode G1 and the gate electrode G2 themselves cannot be processed so as to provide the bent portion. Therefore, under the new layout rule, it is required that the gate electrode G1 and the gate electrode G2 each formed of the polysilicon film are formed in straight-line shapes and the gate electrode G1 and the gate electrode G2 are connected to each other by using the wiring L1C of the first wiring layer. As described above, under the new layout rule, the wiring L1C of the first wiring layer for electrically connecting between the gate electrode G1 and the gate electrode G2 to each other is required.

Under such a circumstance, when the conventional design method is adopted, in which the protruding wiring PL1B for connecting between the power supply wiring L1B and the n-type semiconductor region NDR is formed so as to connect the power supply wiring L1B and the n-type semiconductor region NDR at the shortest distance, a margin between the protruding wiring PL1B and the wiring L1C is decreased, and short failure between the protruding wiring PL1B and the wiring L1C tends to occur.

Figure 21:
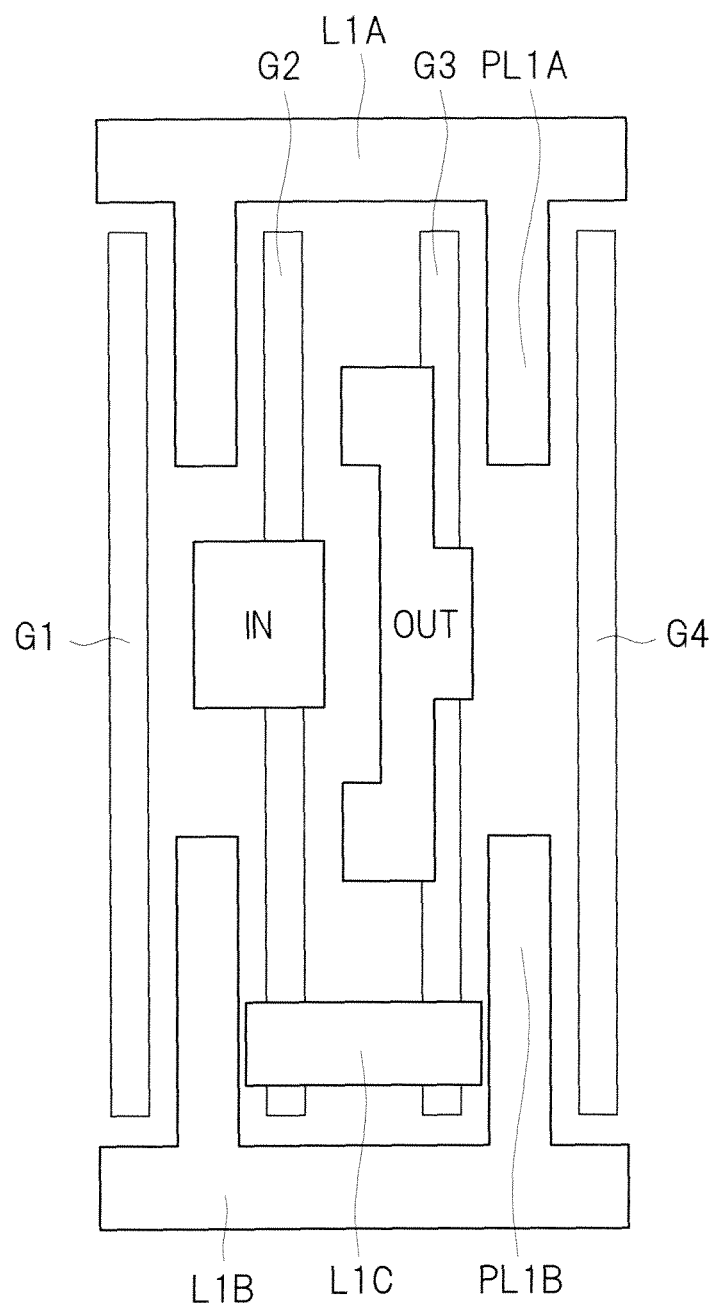
FIG. 21 is a diagram illustrating a gate electrode and a wiring configuring a first wiring layer in an inverter circuit of a comparative example including two inverters.

This matter will be described with reference to FIG. 21 illustrating a comparative example. FIG. 21 is a diagram illustrating the gate electrodes G1 to G4 and wirings configuring the first wiring layer in an inverter circuit including two inverters. In FIG. 21, since the new layout rule that the gate electrodes (polysilicon films) are arranged at the same interval and the gate electrodes have straight-line shapes without being bent at all is taken, the gate electrode G2 and the gate electrode G3 are connected to each other via the wiring L1C formed in the first wiring layer. In this state, when the protruding wiring PL1B which protrudes from the power supply wiring L1B is designed with the conventional design method, it is found that there is almost no margin between the protruding wiring PL1B and the wiring L1C as illustrated in FIG. 21, and that the short failure between the protruding wiring PL1B and the wiring L1C tends to occur.

On the other hand, in the second embodiment, the protruding wirings PL1B protrude from the corners of both ends of the standard cell CL as illustrated in FIG. 4B. Therefore, as compared with the case illustrated in FIG. 21, the margin between the protruding wiring PL1B and the wiring L1C formed in the first wiring layer can be sufficiently ensured. That is, in the second embodiment, the protruding wirings PL1B are configured so as to be drawn from the both ends of the standard cell CL, and therefore, the space between the wiring L1C and the protruding wiring PL1B can be sufficiently ensured. From this viewpoint, the second embodiment has the advantage that the short failure between the wiring L1C and the protruding wiring PL1B can be suppressed, and, as a result, reliability of the semiconductor device can be improved.

As described above, the second embodiment has a characteristic in which the layout is structured so that the wiring L1C of the first wiring layer which extends in the X direction and connects between two gate electrodes G1 and G2 is formed in a distant region between the power supply wiring L1B which extends in the X direction and the bent portion BD1B which is bent in the X direction. This technical idea can further be expanded. For example, the layout of the protruding wirings PL1B can be structured so that at least one or more wirings of the first wiring layer which extend in the X direction are formed in the distant region between the power supply wiring L1B which extends in the X direction and the bent portion BD1B which is bent in the X direction. More particularly, this is effective when the wiring of the first wiring layer formed in the distant region is a wiring for electrically connecting among two or more gate electrodes included in a plurality of gate electrodes.

Note that, as a modification example of the second embodiment, the layout may be structured so that the wiring of the first wiring layer which extends in the X direction and connects between the two gate electrodes G1 and G2 is formed in a distant region between the power supply wiring L1A which extends in the X direction and the bent portion BD1A which is bent in the X direction. Also in this case, the technical idea can be easily expanded. For example, the layout of the protruding wirings PL1A can be structured so that at least one or more wirings of the first wiring layer which extend in the X direction are formed in the distant region between the power supply wiring L1A which extends in the X direction and the bent portion BD1A which is bent in the X direction. More particularly, this is effective when the wiring of the first wiring layer formed in the distant region is a wiring for electrically connecting among two or more gate electrodes included in a plurality of gate electrodes.

Subsequently, the device structure of the inverter circuit in the second embodiment will be explained. FIG. 6 is a cross-sectional view cut along a line A-A in FIG. 4. In FIG. 6, in the semiconductor device in the second embodiment, element isolation regions STI are formed in a main surface of a semiconductor substrate 1S, and a region sectioned by these element isolation regions STI is an active region. And, an n-type well NWL and a p-type well PWL are formed in the semiconductor substrate 1S. The n-type well NWL is a semiconductor region obtained by doping an n-type impurity (donor) such as phosphorous or arsenic to the semiconductor substrate 1S, and the p-type well PWL is a semiconductor region obtained by doping a p-type impurity (acceptor) such as boron to the semiconductor substrate 1S. In a surface region of a part of the n-type well NWL, an n-type power feeding region NR1 for supplying power to the n-type well NWL is formed. On the other hand, in a surface region of a part of the p-type well PWL, a p-type power feeding region PR1 for supplying power to the p-type well PWL is formed.

Next, on the semiconductor substrate 1S where the element isolation region STI, the n-type well NWL, and the p-type well PWL are formed, for example, a gate insulating film GOX of a silicon oxide film is formed. On this gate insulating film GOX, for example, the gate electrode G1 of a polysilicon film is formed.

Note that the gate insulating film GOX can be formed, for example, of an insulating film such as a silicon oxide film by using, for example, a thermal oxidation method. However, the gate insulating film GOX is not limited to the silicon oxide film but is variously changeable, and the gate insulating film GOX may be, for example, a silicon oxynitride film (SiON). That is, a structure in which nitrogen is segregated on an interface between the gate insulating film GOX and the semiconductor substrate 1S may be adopted. The silicon oxynitride film has higher effects of suppressing occurrence of an interface state in a film and reducing electron trap than those of the silicon oxide film. Therefore, hot-carrier resistance of the gate insulating film GOX can be improved, and insulation resistance can be improved. Also, the impurity is difficult to penetrate through the silicon oxynitride film compared with the silicon oxide film. Therefore, by using the silicon oxynitride film for the gate insulating film GOX, variation in a threshold voltage due to diffusion of the impurity in the gate electrodes into the semiconductor substrate side can be suppressed. In order to form the silicon oxynitride film, for example, the semiconductor substrate 1S may be thermally treated in atmosphere containing nitrogen such as NO, $NO_2$, or $NH_3$. Also, a similar effect can be obtained by forming a gate insulating film formed of a silicon oxide film in the surface of the semiconductor substrate 1S, and then, thermally treating the semiconductor substrate 1S in an atmosphere containing nitrogen to segregate nitrogen on an interface between the gate insulating film GOX and the semiconductor substrate 1S.

Also, the gate insulating film GOX may be formed of, for example, a high dielectric film having a higher dielectric constant than that of the silicon oxide film. Conventionally, the silicon oxide film is used as the gate insulating film from a viewpoint of a high insulation resistance and excellent electrical and physical stabilities of an interface between silicon and silicon oxide. Here, in the second embodiment, a microfabricated transistor of a 28-nm node or advanced generation is targeted, and therefore, the gate insulating film GOX is thinner because of the scaling law. If such a thin silicon oxide film is used as the gate insulating film GOX, so-called tunnel current occurs, in which electrons flowing through a channel of the transistor tunnel a barrier formed by the silicon oxide film and flow into the gate electrodes.

Accordingly, by using a material having a higher dielectric constant than that of the silicon oxide film, a high dielectric film whose physical film thickness can be increased even whose capacitance is the same has been used. According to the high dielectric film, since the physical film thickness can be increased even if the capacitance is the same, a leakage current can be reduced. More particularly, while a silicon nitride film is also a film having a higher dielectric constant than that of the silicon oxide film. However, in the second embodiment, it is preferred to use a higher dielectric film than that of this silicon nitride film.

For example, as the film having the higher dielectric constant than that of the silicon nitride film, a hafnium oxide film ($HfO_2$ film) which is one of hafnium oxides is used. However, instead of the hafnium oxide film, other hafnium-based insulating film can be used, such as a HfAlO film (hafnium aluminate film), a HfON film (hafnium oxynitride film), a HfSiO film (hafnium silicate film), or a HfSiON film (hafnium silicon oxynitride film). Further, as these hafnium-based insulating films, a hafnium-based insulating film to which an oxide is introduced such as tantalum oxide, niobium oxide, titanium oxide, zirconium oxide, lanthanum oxide, or yttrium oxide, can be used. Similarly to the hafnium oxide film, the hafnium-based insulating film has a higher dielectric constant than those of the silicon oxide film and the silicon oxynitride film, and therefore, an effect similar to that in the case of using the hafnium oxide film can be obtained. As described above, when the gate insulating film GOX is thinned, the high dielectric film other than the silicon oxide film can also be used as the gate insulating film GOX.

Subsequently, a contact interlayer insulating film CIL is formed on the semiconductor substrate 1S in which the gate electrode G1 has been formed. This contact interlayer insulating film CIL is formed of, for example, a silicon oxide film whose raw material is TEOS. And, in the contact interlayer insulating film CIL, a plug PLG is formed so as to penetrate through the contact interlayer insulating film CIL and electrically be connected to the gate electrode G1. This plug PLG is formed by, for example, forming a barrier conductive film formed of a titanium/titanium-nitride film in a contact hole formed in the contact interlayer insulating film CIL and burying a tungsten film in the contact hole via this barrier conductive film.

Further, an interlayer insulating film IL1 is formed on the contact interlayer insulating film CIL in which the plug PLG has been formed. This interlayer insulating film IL1 is formed of, for example, a silicon oxide film, or, for example, a low dielectric film having a lower dielectric constant than that of a silicon oxide film such as a SiOC film. And, a wiring trench is formed in this interlayer insulating film IL1, a barrier conductive film is formed on an inner wall of this wiring trench, and a copper film is buried in the wiring trench via this barrier conductive film. In this manner, a wiring L1 formed of a copper wiring is formed. Note that the barrier conductive film is formed of, for example, a stacked film of a tantalum/tantalum nitride film. As described above, the devise structure in cutting along the line A-A in FIG. 4B has been described.

Figure 7:
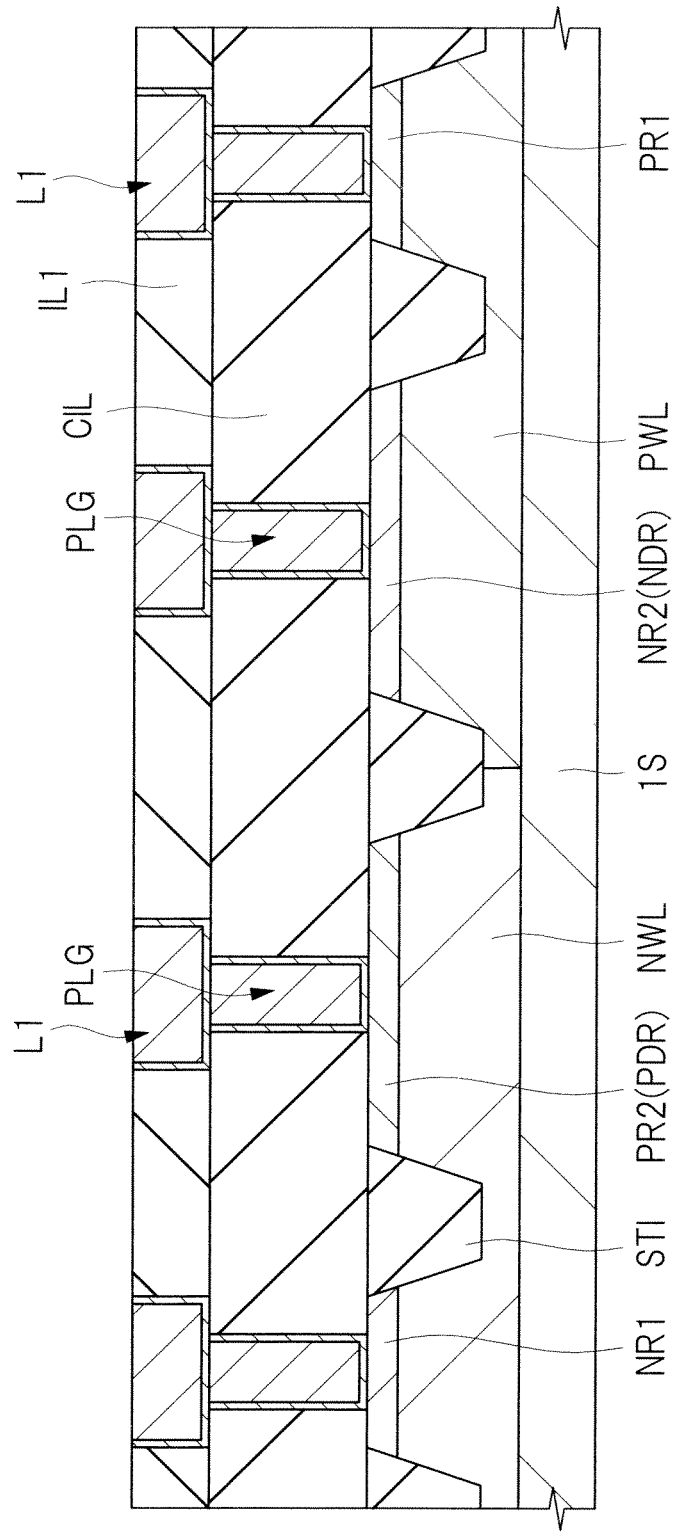
FIG. 7 is a cross-sectional view cut along a line B-B in FIG. 4B.

Next, FIG. 7 is a cross-sectional view cut along a line B-B in FIG. 4B. In FIG. 7, in the semiconductor device in the second embodiment, element isolation regions STI are formed in the main surface of the semiconductor substrate 1S, and a region sectioned by these element isolation regions STI is an active region. And, an n-type well NWL and a p-type well PWL are formed in the semiconductor substrate 1S. The n-type well NWL is a semiconductor region obtained by doping an n-type impurity (donor) such as phosphorous or arsenic to the semiconductor substrate 1S, and the p-type well PWL is a semiconductor region obtained by doping a p-type impurity (acceptor) such as boron to the semiconductor substrate 1S. In a surface region of a part of the n-type well NWL, an n-type power feeding region NR1 for supplying power to the n-type well NWL is formed. On the other hand, in a surface region of a part of the p-type well PWL, a p-type power feeding region PR1 for supplying power to the p-type well PWL is formed. Also, in the active region sectioned by the element isolation regions STI, a deep p-type impurity diffusion region PR2 to be a source region or a drain region is formed on a surface of the n-type well NWL, and a deep n-type impurity diffusion region NR2 to be a source region or a drain region is formed on a surface of the p-type well PWL. The deep p-type impurity diffusion region PR2 is a semiconductor region to which a p-type impurity such as boron is doped, and the deep n-type impurity diffusion region NR2 is a semiconductor region to which an n-type impurity such as phosphorous or arsenic is doped.

Subsequently, the contact interlayer insulating film CIL is formed on the semiconductor substrate 1S. This contact interlayer insulating film CIL is formed of, for example, a silicon oxide film whose raw material is TEOS. And, in the contact interlayer insulating film CIL, a plug PLG is formed so as to penetrate through the contact interlayer insulating film CIL and electrically be connected to the n-type power feeding region NR1, the deep p-type impurity diffusion region PR2, the deep n-type impurity diffusion region NR2, and the p-type power feeding region PR1. The plug PLG is formed by, for example, forming a barrier conductive film formed of a titanium/titanium-nitride film in a contact hole formed in the contact interlayer insulating film CIL and burying a tungsten film in the contact hole via this barrier conductive film.

Further, the interlayer insulating film IL1 is formed on the contact interlayer insulating film CIL in which the plug PLG has been formed. This interlayer insulating film IL1 is formed of, for example, a silicon oxide film, or, for example, a low dielectric film having a lower dielectric constant than that of a silicon oxide film such as a SiOC film. And, a wiring trench is formed in this interlayer insulating film IL1, a barrier conductive film is formed on an inner wall of this wiring trench, and a copper film is buried in the wiring trench via this barrier conductive film. In this manner, the wiring L1 formed of the copper wiring is formed. Note that the barrier conductive film is formed of, for example, a stacked film of tantalum/tantalum nitride film. As described above, the devise structure in cutting along the line B-B in FIG. 4 has been described.

Figure 8:
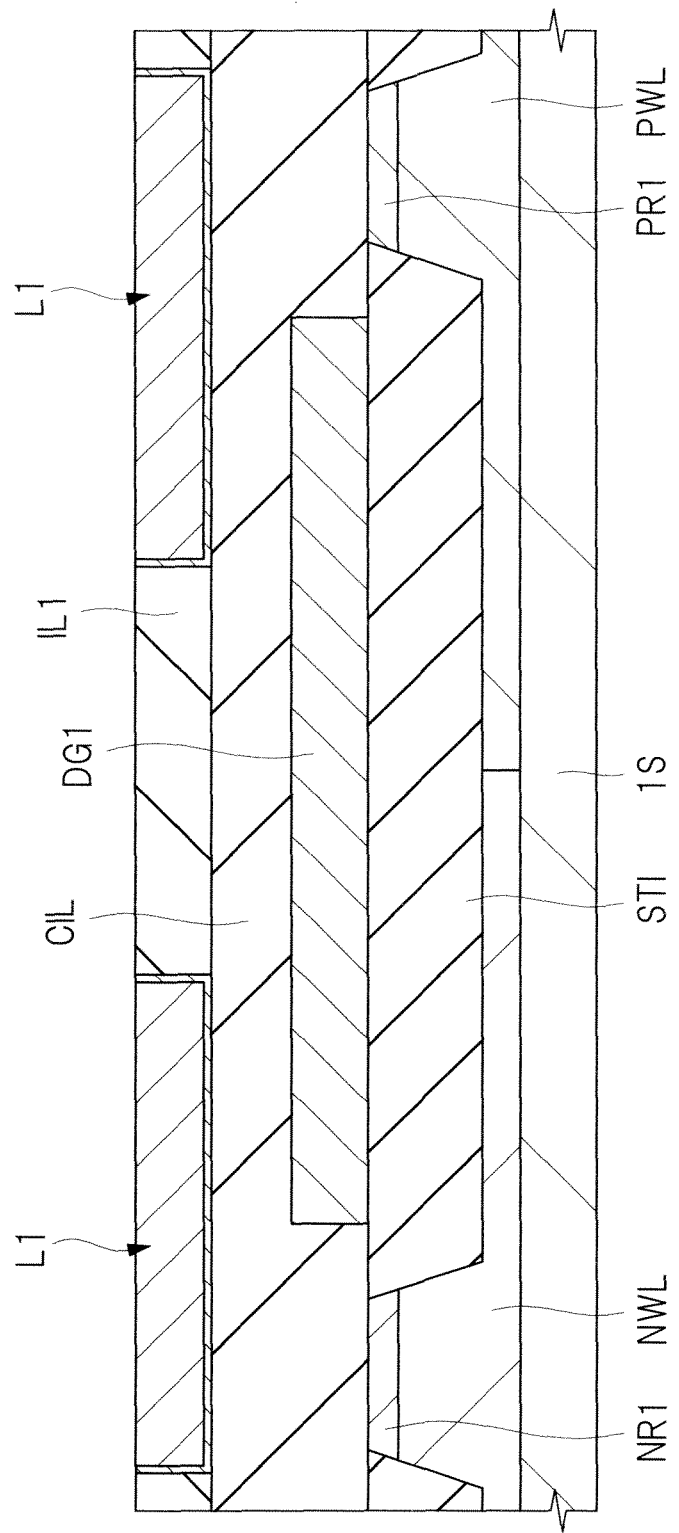
FIG. 8 is a cross-sectional view cut along a line C-C in FIG. 4B.

Next, FIG. 8 is a cross-sectional view cut along a line C-C in FIG. 4. In FIG. 8, in the semiconductor device in the second embodiment, element isolation regions STI are formed in the main surface of the semiconductor substrate 1S, and a region sectioned by these element isolation regions STI is an active region. And, an n-type well NWL and a p-type well PWL are formed in the semiconductor substrate 1S. The n-type well NWL is a semiconductor region obtained by doping an n-type impurity (donor) such as phosphorous or arsenic to the semiconductor substrate 1S, and the p-type well PWL is a semiconductor region obtained by doping a p-type impurity (acceptor) such as boron to the semiconductor substrate 1S. In a surface region of a part of the n-type well NWL, an n-type power feeding region NR1 for supplying power to the n-type well NWL is formed. On the other hand, in a surface region of a part of the p-type well PWL, a p-type power feeding region PR1 for supplying power to the p-type well PWL is formed.

And, the dummy gate electrode DG1 is formed on the element isolation region STI. This dummy gate electrode DG1 is an electrode not functioning as a gate electrode of the MISFET, and is normally in a floating state.

Subsequently, the contact interlayer insulating film CIL is formed on the semiconductor substrate 1S in which the dummy gate electrode DG1 has been formed. This contact interlayer insulating film CIL is formed of, for example, a silicon oxide film whose raw material is TEOS.

Further, the interlayer insulating film IL1 is formed on the contact interlayer insulating film CIL. This interlayer insulating film IL1 is formed of, for example, a silicon oxide film, or, for example, a low dielectric film having a lower dielectric constant than that of a silicon oxide film such as a SiOC film. And, a wiring trench is formed in this interlayer insulating film IL1, a barrier conductive film is formed on an inner wall of this wiring trench, and a copper film is buried in the wiring trench via this barrier conductive film. In this manner, the wiring L1 formed of the copper wiring is formed. Note that the barrier conductive film is formed of, for example, a stacked film of tantalum/tantalum nitride film. As described above, the device structure in cutting along the line C-C in FIG. 4 has been described.

Figure 9:
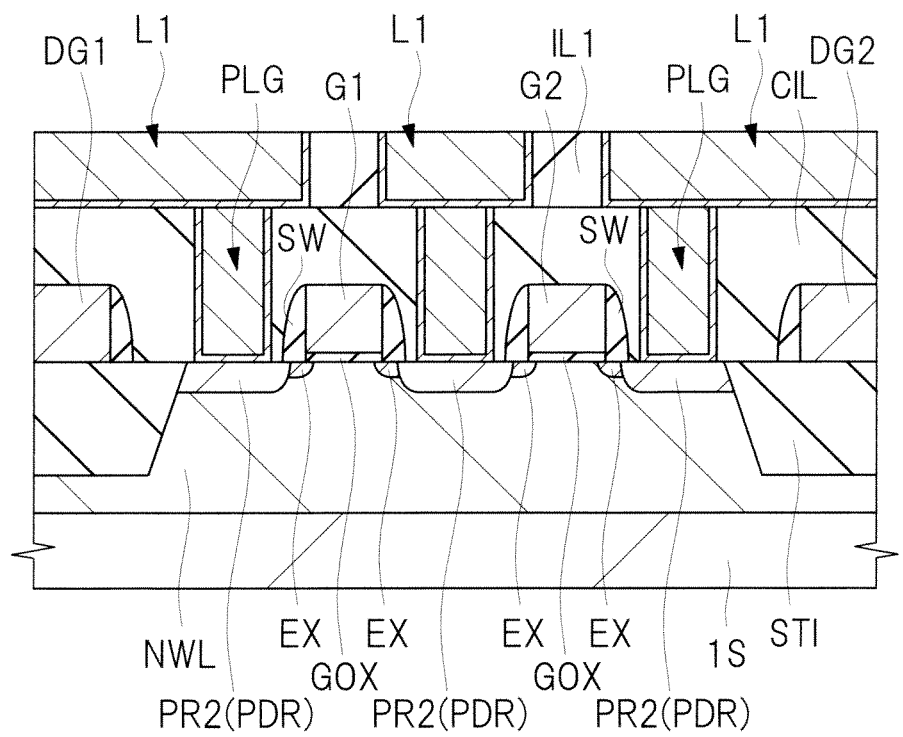
FIG. 9 is a cross-sectional view cut along a line D-D in FIG. 4B.

Next, FIG. 9 is a cross-sectional view cut along a line D-D in FIG. 4. In FIG. 9, in the semiconductor device in the second embodiment, element isolation regions STI are formed in the main surface of the semiconductor substrate 1S, and a region sectioned by these element isolation regions STI is an active region. And, an n-type well NWL is formed in the semiconductor substrate 1S. The n-type well NWL is a semiconductor region obtained by doping an n-type impurity (donor) such as phosphorous or arsenic to the semiconductor substrate 1S.

On the semiconductor substrate 1S in which the n-type well NWL and the element isolation region STI have been formed, the dummy gate electrode DG1, the gate electrode G1, the gate electrode G2, and the dummy gate electrode DG2 are formed. On a side wall of each of these electrodes, a side wall SW is formed. The gate insulating film GOX is formed between the gate electrode G1 and the n-type well NWL. Further, a shallow p-type impurity diffusion region EX which is aligned to the gate electrode G1 is formed in the n-type well NWL, and a deep p-type impurity diffusion region PR2 is formed outside this shallow p-type impurity diffusion region EX. With these shallow p-type impurity diffusion region EX and deep p-type impurity diffusion region PR2, the source region and the drain region are formed.

Similarly, the gate insulating film GOX is formed between the gate electrode G2 and the n-type well NWL. Further, the shallow p-type impurity diffusion region EX which is aligned to the gate electrode G2 is formed in the n-type well NWL, and the deep p-type impurity diffusion region PR2 is formed outside this shallow p-type impurity diffusion region EX. With these shallow p-type impurity diffusion region EX and deep p-type impurity diffusion region PR2, the source region and the drain region are formed.

Note that a silicide film may be formed on a surface of the gate electrode G1, a surface of the gate electrode G2, and a surface of the deep p-type impurity diffusion region PR2 in order to decrease a resistance.

A contact interlayer insulating film CIL is formed on the semiconductor substrate 1S in which the dummy gate electrode DG1, the gate electrode G1, the gate electrode G2, and the dummy gate electrode DG2 have been formed. This contact interlayer insulating film CIL is formed of, for example, a silicon oxide film whose raw material is TEOS. And, in the contact interlayer insulating film CIL, a plug PLG is formed so as to penetrate through the contact interlayer insulating film CIL and electrically be connected to the deep p-type impurity diffusion region PR2. The plug PLG is formed by, for example, forming a barrier conductive film of a titanium/titanium-nitride film in a contact hole formed in the contact interlayer insulating film CIL and burying a tungsten film in the contact hole via this barrier conductive film.

Further, an interlayer insulating film IL1 is formed on the contact interlayer insulating film CIL in which the plug PLG has been formed. This interlayer insulating film IL1 is formed of, for example, a silicon oxide film, or, for example, a low dielectric film having a lower dielectric constant than that of a silicon oxide film such as a SiOC film. And, a wiring trench is formed in this interlayer insulating film IL1, a barrier conductive film is formed on an inner wall of this wiring trench, and a copper film is buried in the wiring trench via this barrier conductive film. In this manner, the wiring L1 formed of the copper wiring is formed. Note that the barrier conductive film is formed of, for example, a stacked film of tantalum/tantalum-nitride film. As described above, the devise structure in cutting along the line D-D in FIG. 4 has been described.

Third Embodiment

FIG. 10A is a circuit diagram illustrating an exclusive-OR (EX-OR) circuit connected among an input wiring IN1, an input wiring IN2, and an output wiring OUT, and FIG. 10B is a plan view illustrating an example of a layout structure of the EX-OR circuit illustrated in FIG. 10A. In FIG. 10A, the EX-OR circuit includes five p-type MISFETs (P1 to P5) and five n-type MISFETs (N1 to N5). And, the input wiring IN1 is electrically connected to a gate electrode of the p-type MISFET (P1), a gate electrode of the n-type MISFET (N2), a gate electrode of the p-type MISFET (P5), and a gate electrode of the n-type MISFET (N5). Also, the input wiring IN2 is electrically connected to a gate electrode of the n-type MISFET (N1), a gate electrode of the p-type MISFET (P2), a gate electrode of the n-type MISFET (N4), and a gate electrode of the p-type MISFET (P4). Further, the output wiring OUT is electrically connected to a drain region of the p-type MISFET (P5) and a drain region of the p-type MISFET (P4).

According to the above-structured EX-OR circuit, when signals inputted to the input wiring IN1 and the input wiring IN2 are reversed to each other, a signal "1" is outputted from the output wiring OUT. For example, when a signal "0" is inputted to the input wiring IN1 and a signal "0" is inputted to the input wiring IN2, a signal "0" is outputted from the output wiring OUT. On the other hand, when a signal "1" is inputted to the input wiring IN1 and a signal "0" is inputted to the input wiring IN2, a signal "1" is outputted from the output wiring OUT. Similarly, also when a signal "0" is inputted to the input wiring IN1 and a signal "1" is inputted to the input wiring IN2, a signal "1" is outputted from the output wiring OUT. On the other hand, when a signal "1" is inputted to the input wiring IN1 and a signal "1" is inputted to the input wiring IN2, a signal "0" is outputted from the output wiring OUT.

Next, FIG. 10B is a plan view illustrating an example of a layout structure of the EX-OR circuit illustrated in the circuit diagram of FIG. 10A. In FIG. 10B, the layout structure of the standard cell CL in the third embodiment takes an innovative design idea different from the conventional design method, and also supports a new layout rule. More specifically, as the new layout rule, a rule that gate electrodes (polysilicon films) are arranged at the same interval and the gate electrodes have straight-line shapes without being bent at all or a rule that a diffusion layer has a figure shape with eight or less vertexes is taken.

As illustrated in FIG. 10B, a power supply wiring L1A and a power supply wiring L1B formed in a first wiring layer are arranged so as to sandwich the standard cell CL having a rectangular shape from above and below and extend in an X direction (first direction). This power supply wiring L1A is a wiring for supplying the power supply potential (VDD), and the power supply wiring L1B is a wiring for supplying the reference potential (GND) lower than the power supply potential (VDD). And, a p-type semiconductor region (p-type diffusion layer) PDR and an n-type semiconductor region (n-type diffusion layer) NDR are formed so as to be sandwiched between the power supply wiring L1A and the power supply wiring LIB. Each of these p-type semiconductor region PDR and n-type semiconductor region NDR has a quadrangular shape based on the new layout rule that the diffusion layer has the figure shape with eight or less vertexes.

The p-type semiconductor region PDR formed in the standard cell CL is arranged so as not to be in contact with both of a first boundary line which connects between one end of a first side (power supply wiring L1A) and one end of a second side (power supply wiring LIB) of the standard cell CL and a second boundary line which connects between the other end of the first side (power supply wiring L1A) and the other end of the second side (power supply wiring LIE). Similarly, the n-type semiconductor region NDR formed in the standard cell CL is arranged so as not to be in contact with both of the first boundary line which connects between one end of the first side (power supply wiring L1A) and one end of the second side (power supply wiring LIB) of the standard cell CL and the second boundary line which connects between the other end of the first side (power supply wiring L1A) and the other end of the second side (power supply wiring L1B). Therefore, in consideration of a plurality of standard cells CL adjacently arranged in the X direction (first direction), the p-type semiconductor region PDR formed in each of the standard cells CL is isolated from the other p-type semiconductor region, and the n-type semiconductor region NDR formed in each of the standard cells CL is also isolated from the other n-type semiconductor region.

Subsequently, in the standard cell CL in the third embodiment, two protruding wirings PL1A are formed so as to branch from the power supply wiring L1A at both ends of the standard cell CL (a boundary between the standard cells CL) and to protrude in the Y direction (second direction) toward an inside of the standard cell CL. Similarly, two protruding wirings PL1B are formed so as to branch from the power supply wiring L1B at both ends of the standard cell CL (a boundary between the standard cells CL) and to protrude in the Y direction (second direction) toward the inside of the standard cell CL. And, a left-side protruding wiring PL1A of the two protruding wirings PL1A includes a bent portion BD1A whose end is bent in the X direction (first direction) toward the inside of the standard cell CL, and further includes a bent portion BD2A which is bent from the bent portion BD1A in the Y direction, and still further includes a bent portion BD3A which is bent from the bent portion BD2A in the X direction. This bent portion BD3A is electrically connected to the p-type semiconductor region PDR via a plug PLG. On the other hand, a right-side protruding wiring PL1A of the two protruding wirings PL1A does not include a bent portion formed therein.

Meanwhile, each of the two protruding wirings PL1B includes a bent portion BD1B whose end is bent in the X direction (first direction) toward the inside of the standard cell CL, and further includes a bent portion BD2B in the bent portion BD1B whose end is bent in the Y direction (second direction). This bent portion BD2B is electrically connected to the n-type semiconductor region NDR via a plug PLG.

As described above, in the third embodiment, in the protruding wiring PL1A including the bent portion BD1A, the bent portion BD2A, and the bent portion BD3A formed therein, the bent portion BD3A is electrically connected to the p-type semiconductor region PDR via a plug PLG. On the other hand, the protruding wiring PL1B including the bent portion BD1B formed therein further includes the bent portion BD2B which is bent from the end of the bent portion BD1B in the Y direction (second direction), and this bent portion BD2B is electrically connected to the n-type semiconductor region NDR via a plug PLG.

Next, as illustrated in FIG. 10B, in a region inside the standard cell CL sandwiched by the power supply wiring L1A and the power supply wiring L1B, a dummy gate electrode DG1, gate electrodes G1 to G5, and a dummy gate electrode DG2 are arranged so as to extend in the Y direction (second direction) and line in the X direction (first direction). In this manner, for example, p-type MISFETs (P1) to (P5) are formed in respective regions where the gate electrodes G1 to G5 overlap with the p-type semiconductor region PDR in a plane, and n-type MISFETs (N1) to (N5) are formed in respective regions where the gate electrodes G1 to G5 overlap with the n-type semiconductor region NDR in a plane. These gate electrodes G1 to G5 and dummy gate electrodes DG1 and DG2 are formed based on the rule that the gate electrodes (polysilicon films) are arranged at the same interval and the gate electrodes have straight-line shapes without being bent at all. The dummy gate electrodes DG1 and DG2 described here do not overlap with the p-type semiconductor region PDR and the n-type semiconductor region NDR in a plane, and are arranged on a boundary line between the standard cells CL. In other words, the dummy gate electrodes DG1 and DG2 do not function as the gate electrodes of the p-type MISFETs (P1 to P5) and the n-type MISFETs (N1 to N5), and their potentials are in a floating state.

And, the gate electrode G1 is connected to an input wiring IN formed in a first wiring layer via a plug PLG. And, an output wiring OUT is formed so as not to be in contact with the input wiring IN, and this output wiring OUT is arranged over the gate electrode G2 so as not to be in contact with the input wiring IN.

The above-described standard cell CL is configured of components formed in and lower than the first wiring layer, and the input wirings IN1 and IN2 for inputting an input signal to the standard cell CL and the output wiring OUT which is formed in the first wiring layer for outputting an output signal from the standard cell CL are electrically connected to a wiring in an upper layer (second wiring layer) than the first wiring layer. That is, in the third embodiment, the standard cell CL is configured of components in and lower than the first wiring layer, and this standard cell CL is connected in the second wiring layer which is the upper layer than the first wiring layer, so that an arbitral digital circuit (logic circuit) can be formed.

Note that an n-type power feeding region (semiconductor region) for supplying the power supply potential (VDD) to an n-type well is provided right below the power supply wiring L1A, and this n-type power feeding region and the power supply wiring L1A are connected to each other via a plug PLG. Similarly, a p-type power feeding region (semiconductor region) for supplying the reference potential (GND) to a p-type well is provided right below the power supply wiring L1B, and this p-type power feeding region and the power supply wiring L1B are connected to each other via a plug PLG. That is, an N-type well is formed in a semiconductor substrate where the standard cell CL is formed, and the power supply wiring L1A and the N-type well are electrically connected to each other via a plurality of plugs PLG (first via plugs). Similarly, a P-type well is formed in the semiconductor substrate where the standard cell CL is formed, and the power supply wiring L1B and the P-type well are electrically connected to each other via a plurality of plugs (second via plugs). Here, the plurality of plugs PLG (first via plugs and second via plugs) are not formed at four corners of the standard cell CL.

Further, in the third embodiment, the layout is structured so that the input wiring IN2 of the first wiring layer which extends in the X direction and connects between two gate electrodes G1 and G4 is formed in a distant region between the power supply wiring L1B which extends in the X direction and the bent portion BD1B which is bent in the X direction. This technical idea can further be expanded. For example, the layout of the protruding wirings PL1B can be structured so that at least one or more wirings of the first wiring layer which extend in the X direction are formed in the distant region between the power supply wiring L1B which extends in the X direction and the bent portion BD1B which is bent in the X direction. More particularly, this is effective when the wiring of the first wiring layer formed in the distant region is a wiring for electrically connecting among two or more gate electrodes included in a plurality of gate electrodes.

Also, in the third embodiment, the layout is structured so that the input wiring IN1 of the first wiring layer which extends in the X direction and connects between two gate electrodes G2 and G5 is formed in a distant region between the power supply wiring L1A which extends in the X direction and the bent portion BD1A which is bent in the X direction. Also in this case, this technical idea can be easily expanded. For example, the layout of the protruding wirings PL1A can be also structured so that at least one or more wirings of the first wiring layer which extend in the X direction are formed in the distant region between the power supply wiring L1A which extends in the X direction and the bent portion BD1A which is bent in the X direction. More particularly, this is effective when the wiring of the first wiring layer formed in the distant region is a wiring for electrically connecting among two or more gate electrodes included in the plurality of gate electrodes.

Figure 11B:
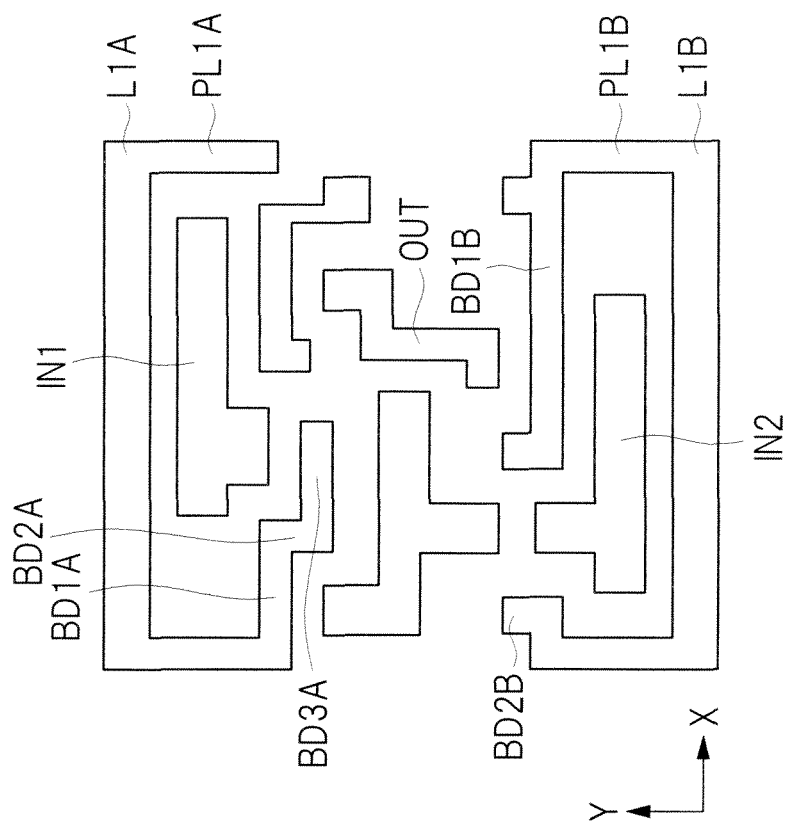
FIGS. 11A and 11B are diagrams illustrating to dissolve the layout structure of the EX-OR circuit into two layers.
Figure 11A:
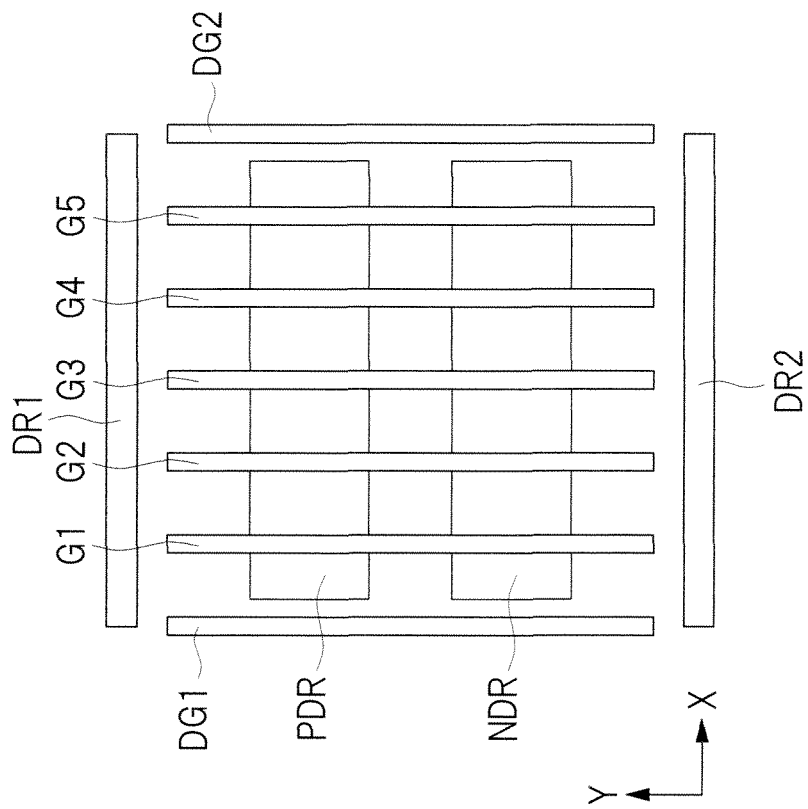

Subsequently, the layout structure of the EX-OR circuit illustrated in FIG. 10B is dissolved into two layers as illustrated in FIGS. 11A to 11D. FIG. 11A is a diagram illustrating the layout structure of a first layer. As illustrated in FIG. 11A, on the semiconductor substrate, an n-type power feeding region DR1, the p-type semiconductor region PDR, the n-type semiconductor region NDR, and a p-type power feeding region DR2 are formed so as to line in the Y direction. All of these regions are formed of a semiconductor region.

Next, as illustrated in FIG. 11A, a dummy gate electrode DG1, gate electrodes G1 to G5, and a dummy gate electrode DG2 are arranged so as to extend in the Y direction and line in the X direction. These dummy gate electrodes DG1 and DG2 and gate electrodes G1 to G5 are formed by processing a polysilicon film.

And, FIG. 11B is a diagram illustrating the layout structure of a second layer. More specifically, in FIG. 11B, as the first wiring layer, the power supply wiring L1A, the power supply wiring L1B, the protruding wiring PL1A, the protruding wiring PL1B, the bent portion BD1A, the bent portion BD2A, the bent portion BD3A, the bent portion BD1B, the bent portion BD2B, the input wiring IN1, the input wiring IN2, and the output wiring OUT are formed therein.

As described above, in the third embodiment, the protruding wirings (PL1A and PL1B) protrude from the power supply wirings (L1A and L1B) at corners of both ends of the standard cell CL toward the inside of the standard cell CL (in the Y direction), and the bent portions (BD1A and BD1B) which are bent from the protruding wirings (PL1A and PL1B) in the X direction are formed. Further, the bent portion BD2A which is bent from the bent portion BD1A in the Y direction and the bent portion BD3A which is bent from the bent portion BD2A in the X direction are formed. Also, the bent portion BD2B which is bent from the bent portion BD1B in the Y direction is formed. And, these bent portions (BD3A and BD2B) and the respective p-type semiconductor region PDR and n-type semiconductor region NDR are connected to each other via the plugs PLG. In this manner, a space can be ensured in the inner region of the standard cell CL, and the degree of flexibility of the layout structure can be improved. Therefore, the degree of flexibility of contriving the layout structure can be increased even in the case of application of the new layout rule introduced in accordance with the microfabrication of the MISFET, so that the layout structure capable of reducing the size of the standard cell CL can be easily adopted.

Fourth Embodiment

Figure 12:
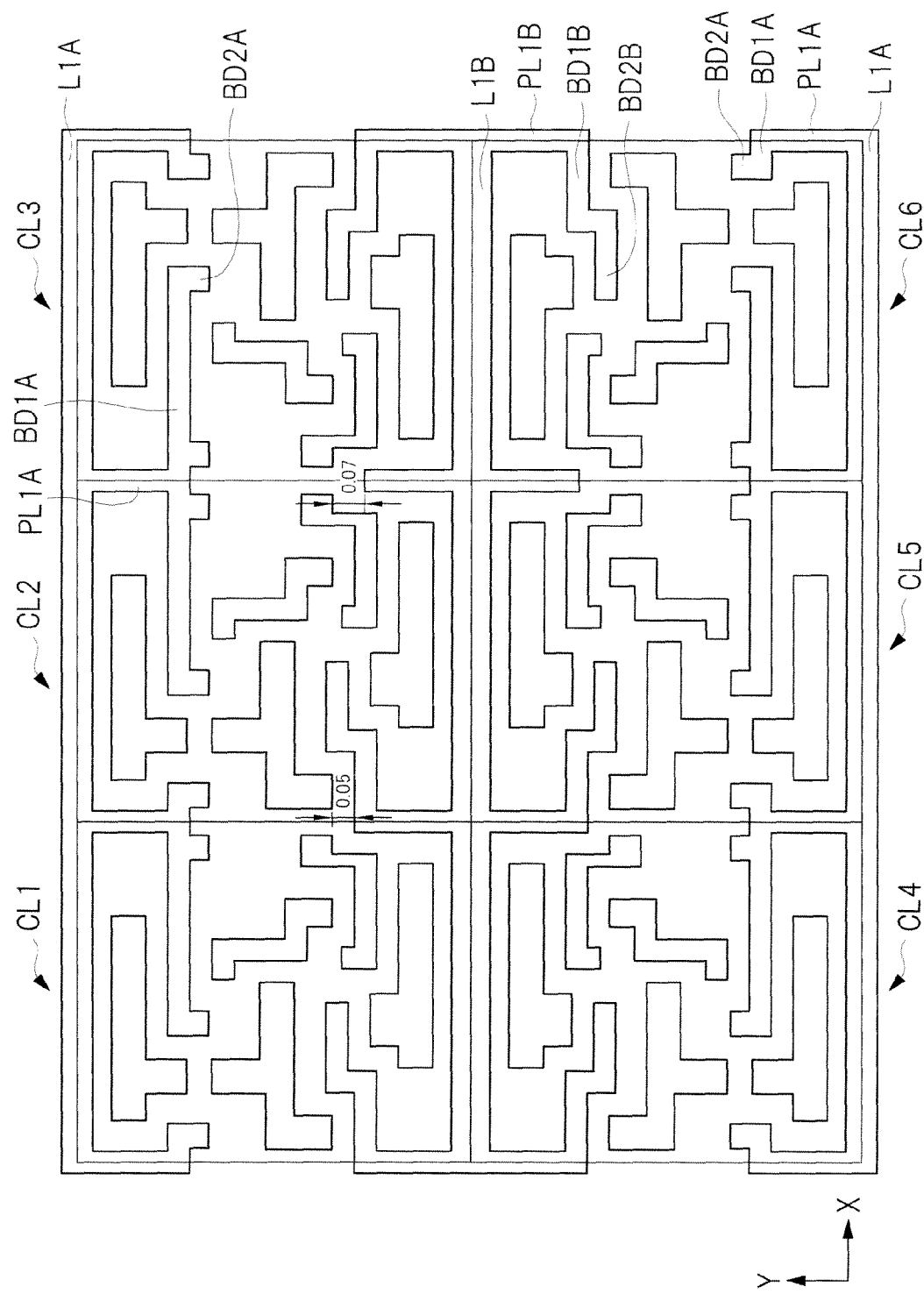
FIG. 12 is a diagram illustrating a layout structure in which six standard cells configuring an EX-OR circuit are arranged in two rows and three columns.

In a fourth embodiment, an example that a plurality of standard cells are actually arranged by taking the technical idea of the present invention will be explained. FIG. 12 is a diagram illustrating a layout structure in which six standard cells CL1 to CL6 configuring an EX-OR circuit are arranged in two rows and three columns. In FIG. 12, a protruding wiring PL1A and a protruding wiring PL1B are drawn out from corners of both ends of each of the standard cells CL1 to CL6. More specifically, the protruding wiring PL1A protrudes from a power supply wiring L1A, and this protruding wiring PL1A includes a bent portion BD1A and a bent portion BD2A. Similarly, the protruding wiring PL1B protrudes from a power supply wiring L1B, and this protruding wiring PL1B includes a bent portion BD1B and a bent portion BD2B.

Here, in the standard cells CL1 to CL6, there are a protruding wiring including the bent portion and a protruding wiring not including the bent portion. In this case, a length of the protruding wiring including the bent portion is slightly different from a length of the protruding wiring not including the bent portion. This is for ensuring a margin between the protruding wiring and its adjacent wiring. That is, both of the protruding wiring including the bent portion and the protruding wiring not including the bent portion are processed by using a photolithography technique. Here, due to the issue of the process accuracy of the photolithography technique, it is required to ensure the margin between the protruding wiring not including the bent portion and its adjacent wiring more than the margin between the protruding wiring including the bent portion and its adjacent wiring. That is, due to the process accuracy of the photolithography technique, a margin for preventing the short failure from occurring between the protruding wiring not including the bent portion and its adjacent wiring is a severer issue than a margin between the protruding wiring including the bent portion and its adjacent wiring. Therefore, as illustrated in FIG. 12, while the margin between the protruding wiring including the bent portion and its adjacent wiring is, for example, 0.05 µm, the margin between the protruding wiring not including the bent portion and its adjacent wiring is, for example, 0.07 µm.

Also, the protruding wirings of the adjacent standard cells have almost the same length. This is because the lengths of the protruding wirings are determined after the margin in each standard cell is ensured based on the process accuracy of the photolithography technique described above and the relation with the adjacent wiring, and therefore, because the lengths of the protruding wirings required by the determination are slightly different in some cases. Accordingly, as compared with the various different lengths of the protruding wirings PL1A of the conventional technique in the case of connection between the power supply wiring L1A and the p-type semiconductor region PDR at the shortest distance, the protruding wirings to which the present embodiment is applied have almost the same length in the standard cell and also among different standard cells.

As illustrated in FIG. 12, in the fourth embodiment, the protruding wirings (PL1A and PL1B) protrude from the power supply wirings (L1A and L1B) at corners of both ends of the standard cell CL toward the inside of the standard cell CL (in the Y direction), and the bent portions (BD1A and BD1B) which are bent from the protruding wirings (PL1A and PL1B) in the X direction are formed. Further, the bent portion BD2A which is bent from the bent portion BD1A in the Y direction and the bent portion BD3A which is bent from the bent portion BD2A in the X direction are formed. Also, the bent portion BD2B which is bent from the bent portion BD1B in the Y direction is formed. And, these bent portions (BD3A and BD2B) and the respective p-type semiconductor region and n-type semiconductor region are connected to each other via plugs.

Further, in the fourth embodiment illustrated in FIG. 12, since the protruding wirings (PL1A and PL1B) are formed at the corners of both ends of each of the standard cells CL1 to CL6, the protruding wirings (PL1A and PL1B) can be shared between adjacent standard cells. From this, the number of protruding wirings (PL1A and PL1B) formed in the standard cells CL1 to CL6 can be decreased.

As described above, in the fourth embodiment, from a synergetic effect of an effect of reducing a size of each of the standard cells CL1 to CL6 by forming the protruding wirings including the bent portion at corners of both ends of each of the standard cells CL1 to CL6 and an effect of reducing a size of each of the standard cells CL1 to CL6 by sharing the protruding wiring between the adjacent standard cells, a sufficient space can be ensured in the inner region of each of the standard cells CL1 to CL6, and the degree of flexibility of the layout structure can be improved. From this, even in the case of application of the new layout rule introduced in accordance with the microfabrication of the MISFET, the degree of flexibility of contriving the layout structure can be increased, and therefore, the layout structure capable of reducing the sizes of the standard cells CL can be easily adopted.

While the example of arranging the standard cells CL1 to CL6 configured of the same EX-OR circuit has been explained in FIG. 12, the technical idea of the present invention can also be applied to a case of arranging the standard cells CL1 to CL6 having different functions. An example of this will be explained below.

FIGS. 13A and 13B are diagrams illustrating the layout structure in which the standard cells CL1 to CL6 having the plurality of different functions are arranged, and FIG. 13A is a diagram illustrating a lower layer of two layers obtained by dissolving the standard cells CL1 to CL6. On the other hand, FIG. 13B is a diagram illustrating an upper layer of the two layers obtained by dissolving the standard cells CL1 to CL6.

As illustrated in FIG. 13A, on the semiconductor substrate, an n-type power feeding region DR1, the p-type semiconductor region PDR, the n-type semiconductor region NDR, and a p-type power feeding region DR2 are formed so as to line in the Y direction. All of these regions are formed of a semiconductor region.

Next, as illustrated in FIG. 13A, a dummy gate electrode DG and a gate electrode G are arranged so as to extend in the Y direction and line in the X direction. These dummy gate electrode DG and gate electrode G are formed by processing a polysilicon film.

And, FIG. 13B is a diagram illustrating the layout structure of a second layer. More specifically, in FIG. 13B, as the first wiring layer, the power supply wiring L1A, the power supply wiring L1B, the protruding wiring PL1A, the protruding wiring PL1B, the bent portion BD1A, the bent portion BD2A, the bent portion BD1B, the bent portion BD2B, and others are formed therein.

Here, the standard cell CL1 is a three-input NAND circuit, and the standard cell CL2 is a four-input NAND circuit. Also, the standard cell CL3 is a complex circuit (selector), and the standard cell CL4 is an EX-OR circuit. Further, the standard cell CL5 is a complex circuit (selector), and the standard cell CL6 is a two-input NOR circuit.

As described above, also in FIGS. 13A and 13B, the protruding wirings (PL1A and PL1B) protrude from the power supply wirings (L1A and L1B) at corners of both ends of each of the standard cells CL1 to CL6 toward the inside of the standard cells CL (in the Y direction), and the bent portions (BD1A and BD1B) which are bent from the protruding wirings (PL1A and PL1B) in the X direction are formed. Further, the bent portion BD2A which is bent from the bent portion BD1A in the Y direction is formed. Also, the bent portion BD2B which is bent from the bent portion BD1B in the Y direction is formed. And, these bent portions (BD2A and BD2B) and the respective p-type semiconductor region and n-type semiconductor region are connected to each other via plugs.

Further, also in the case illustrated in FIGS. 13A and 13B, since the protruding wirings (PL1A and PL1B) are formed at corners of both ends of each of the standard cells CL1 to CL6, the protruding wirings (PL1A and PL1B) can be shared between adjacent standard cells. From this, the number of protruding wirings (PL1A and PL1B) formed in the standard cells CL1 to CL6 can be decreased.

As described above, even in the case of arranging the standard cells CL1 to CL6 having the different functions from each other, a synergetic effect can be obtained, the synergetic effect being of an effect of reducing a size of each of the standard cells CL1 to CL6 by forming the protruding wirings including the bent portion at corners of both ends of each of the standard cells CL1 to CL6 and an effect of reducing a size of each of the standard cells CL1 to CL6 by sharing the protruding wiring between the adjacent standard cells. As a result, a sufficient space can be ensured in the inner region of each of the standard cells CL1 to CL6, and the degree of flexibility of the layout structure can be improved. From this, even in the case of application of the new layout rule introduced in accordance with the microfabrication of the MISFET, the degree of flexibility of contriving the layout structure can be increased, and therefore, the layout structure capable of reducing the size of each of the standard cells CL can be easily adopted.

Fifth Embodiment

Figure 14:
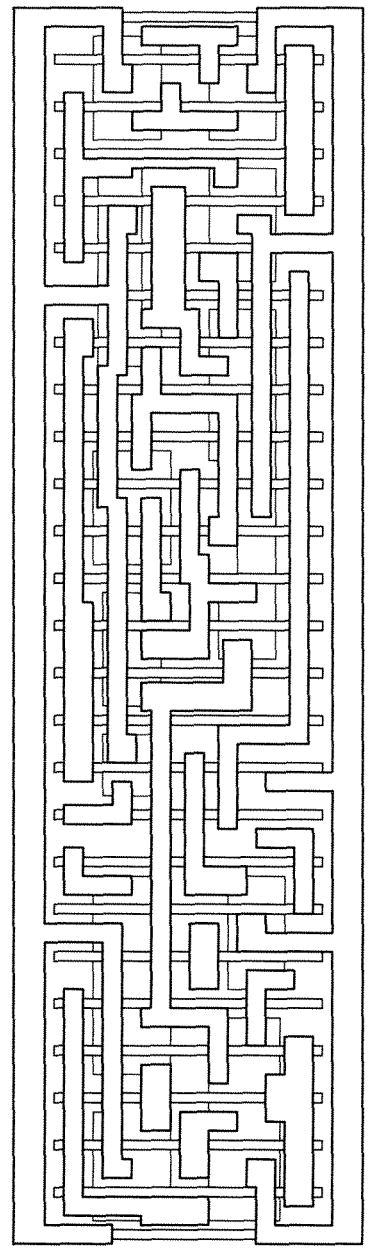
FIG. 14 is a diagram illustrating a layout structure of a standard cell in which a flip-flop circuit with a SCAN function is formed.

In a fifth embodiment, an example of a layout structure of a standard cell in which a flip-flop circuit with a SCAN function is formed will be described. FIG. 14 is a diagram illustrating the layout structure of the standard cell CL in which the flip-flop circuit with the SCAN function is formed. Also in FIG. 14, as the new layout rule, a rule that gate electrodes (polysilicon films) are arranged at the same interval and the gate electrodes have straight-line shapes without being bent at all or a rule that a diffusion layer has a figure shape with eight or less vertexes is taken. Even under a circumstance in which such a new layout rule is taken, the standard cell CL in the fifth embodiment has a characteristic in which the standard cell CL including the flip-flop circuit with the SCAN function formed thereon can be formed of only a first wiring layer and a component in a lower layer than the first wiring layer by using the technical idea of the present invention.

Figure 15:
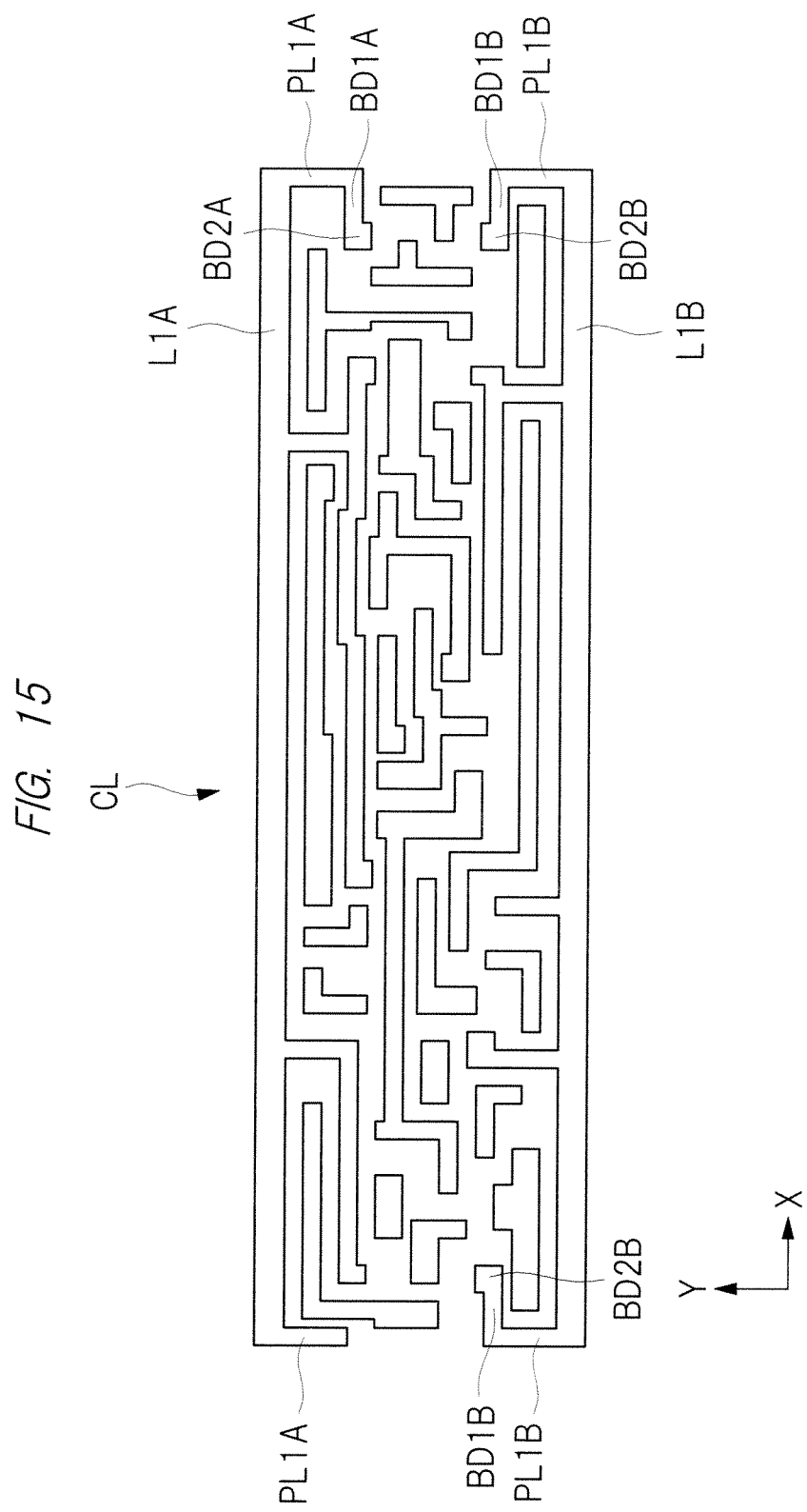
FIG. 15 is a diagram illustrating a layout structure of a first wiring layer of a standard cell in which a flip-flop circuit with a SCAN function is formed in a fifth embodiment.

FIG. 15 is a diagram illustrating a layout structure of the first wiring layer of the standard cell CL in which the flip-flop circuit with the SCAN function in the fifth embodiment is formed. As illustrated in FIG. 15, protruding wirings PL1A and protruding wirings PL1B protrude from four corners of the standard cell CL. More specifically, the protruding wirings PL1A protrude from a power supply wiring L1A at corners of both ends of the standard cell CL toward an inside of the standard cell CL (in a Y direction). More particularly, from the protruding wiring PL1A formed at the right-side corner, a bent portion BD1A which is bent in an X direction is drawn out. And, from the bent portion BD1A, a bent portion BD2A which is bent in the Y direction is drawn out. On the other hand, the protruding wirings PL1B protrude from a power supply wiring L1B at corners of both ends of the standard cell CL toward the inside of the standard cell CL (in the Y direction). And, from the protruding wirings PL1B formed at the both-side corners, bent portions BD1B which are bent in the X direction are drawn out. From these bent portions BD1B, bent portion BD2B which are bent in the Y direction are drawn out.

As described above, also in the fifth embodiment, the protruding wirings (PL1A and PL1B) are drawn out from the corners of the standard cell CL, and the bent portions (BD1A, BD2A, BD1B, and BD2B) are provided in these drawn protruding wirings (PL1A and PL1B), so that a power supply potential (VDD) and a reference potential (GND) are supplied to the standard cell CL. Therefore, the number of protruding wirings formed inside the standard cell CL can be reduced. This means increase in the space provided inside the standard cell CL. Therefore, a sufficient space can be ensured in the inner region of the standard cell CL including the flip-flop circuit with the SCAN function formed thereon in the fifth embodiment, and the degree of flexibility of the layout structure can be improved. Therefore, even in the case of application of the new layout rule introduced in accordance with the microfabrication of the MISFET, the degree of flexibility of contriving the layout structure is increased, and therefore, the size of the standard cell CL can be reduced.

Figure 16:
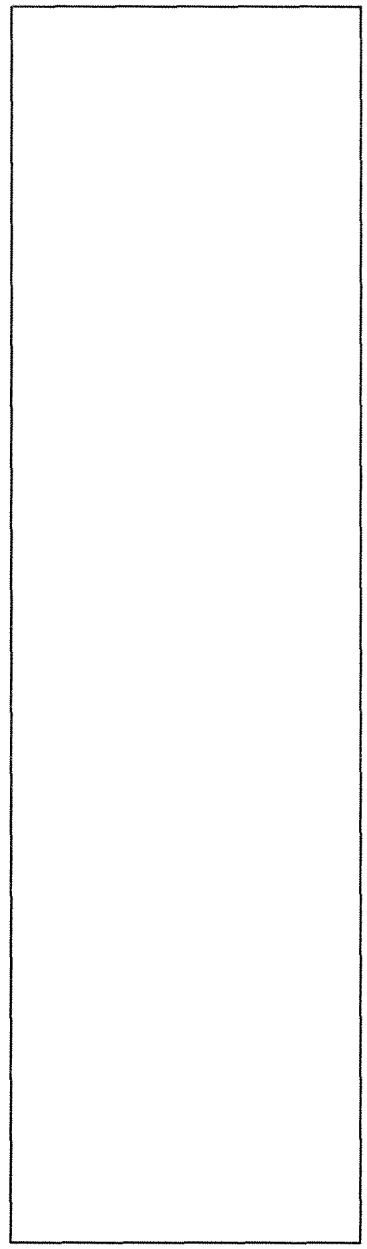
FIG. 16 is a diagram illustrating a second wiring layer of the standard cell in the fifth embodiment.
Figure 17:
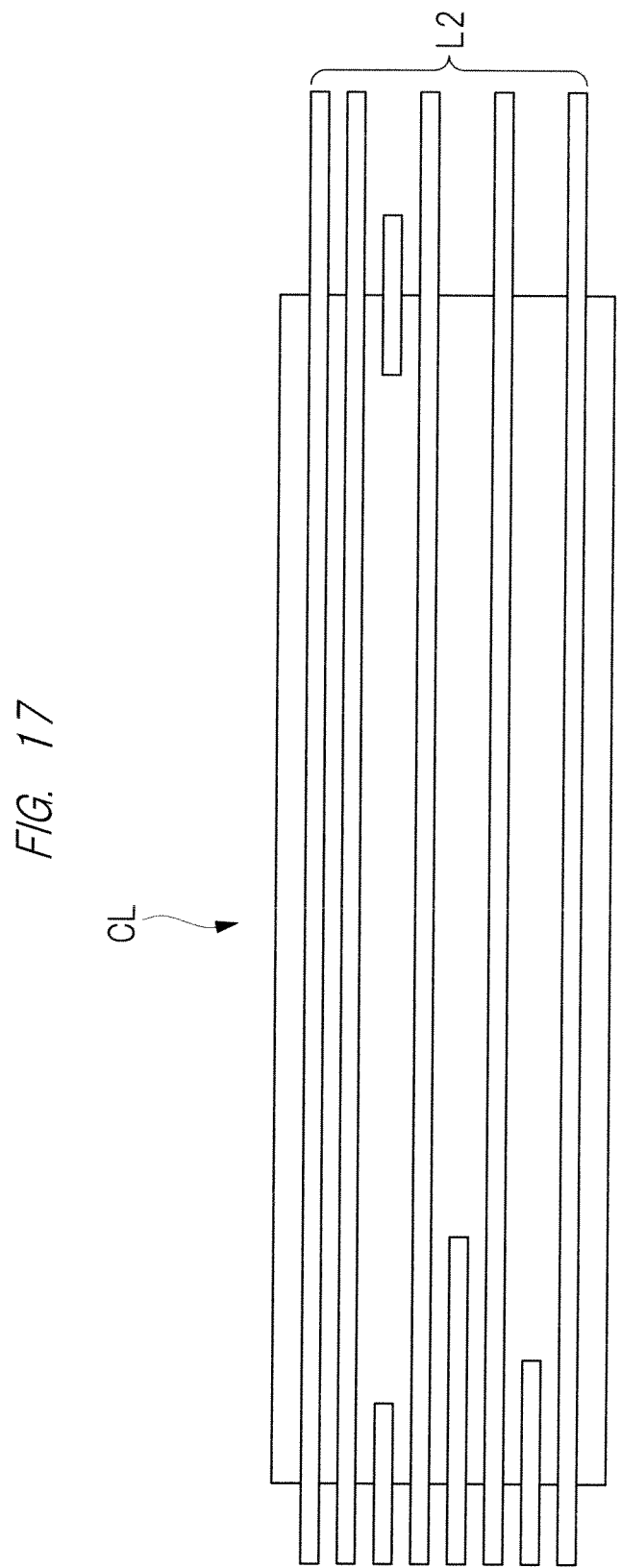
FIG. 17 is a diagram illustrating an example of a layout structure of a wiring for connecting between standard cells in the second wiring layer.

And, since the sufficient space can be ensured in the inner region of the standard cell CL in the fifth embodiment, the flip-flop circuit with the SCAN function can be formed of only the first wiring layer and a component in the lower layer than this first wiring layer. For example, FIG. 16 is a diagram illustrating a second wiring layer of the standard cell CL in the fifth embodiment, and it is found that there is no wiring for configuring the flip-flop circuit formed in a second layer (second wiring layer) which is an upper layer than a first layer (first wiring layer). That is, the standard cell CL including the flip-flop circuit with the SCAN function in the fifth embodiment formed thereon is formed of only the first wiring layer and the component in the lower layer than this first wiring layer. Therefore, according to the standard cell CL in the fifth embodiment, the second wiring layer is not used as a wiring for configuring the standard cell CL itself but can be freely used as a wiring for connecting between the standard cells CL. For example, FIG. 17 is a diagram illustrating an example of a layout structure of wirings L2 for connecting between the standard cells CL in the second wiring layer. As illustrated in FIG. 17, in the fifth embodiment, since the second wiring layer is not used by the standard cell CL itself, the layout of the wirings L2 for connecting between the standard cells CL can be freely structured. This means that the second wiring layer can be effectively utilized and wiring density in the second wiring layer can be improved. The layout of the wirings L2 can be efficiently structured, and, as a result, a size of the semiconductor device can be reduced.

For example, when standard cells not adjusted to each other are connected, in a case that a wiring for configuring a standard cell is laid out in the second wiring layer, it is required to arrange a wiring so as to be bent or arrange a wiring so as to bypass to a third wiring layer. However, in the fifth embodiment, since the wiring for configuring the standard cell is not arranged in the second wiring layer, a wiring can be linearly arranged by using the second wiring layer of a standard cell sandwiched between standard cells which are to be connected to each other, so that an efficient layout can be achieved.

Figure 22:
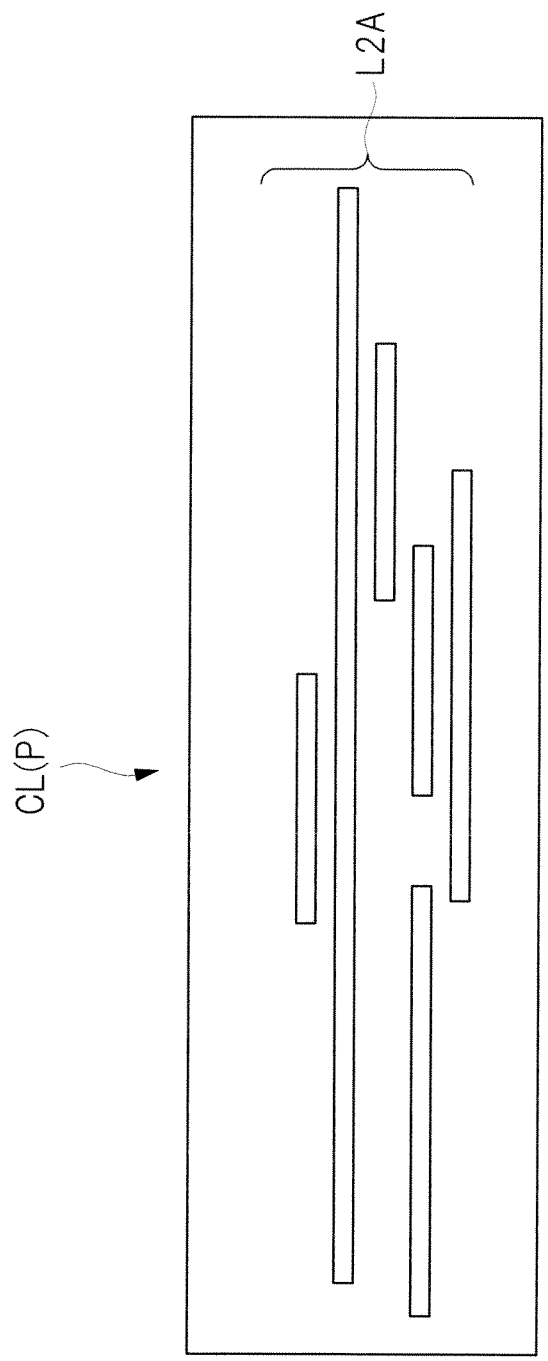
FIG. 22 is a diagram illustrating a second wiring layer of a standard cell in the comparative example.
Figure 23:
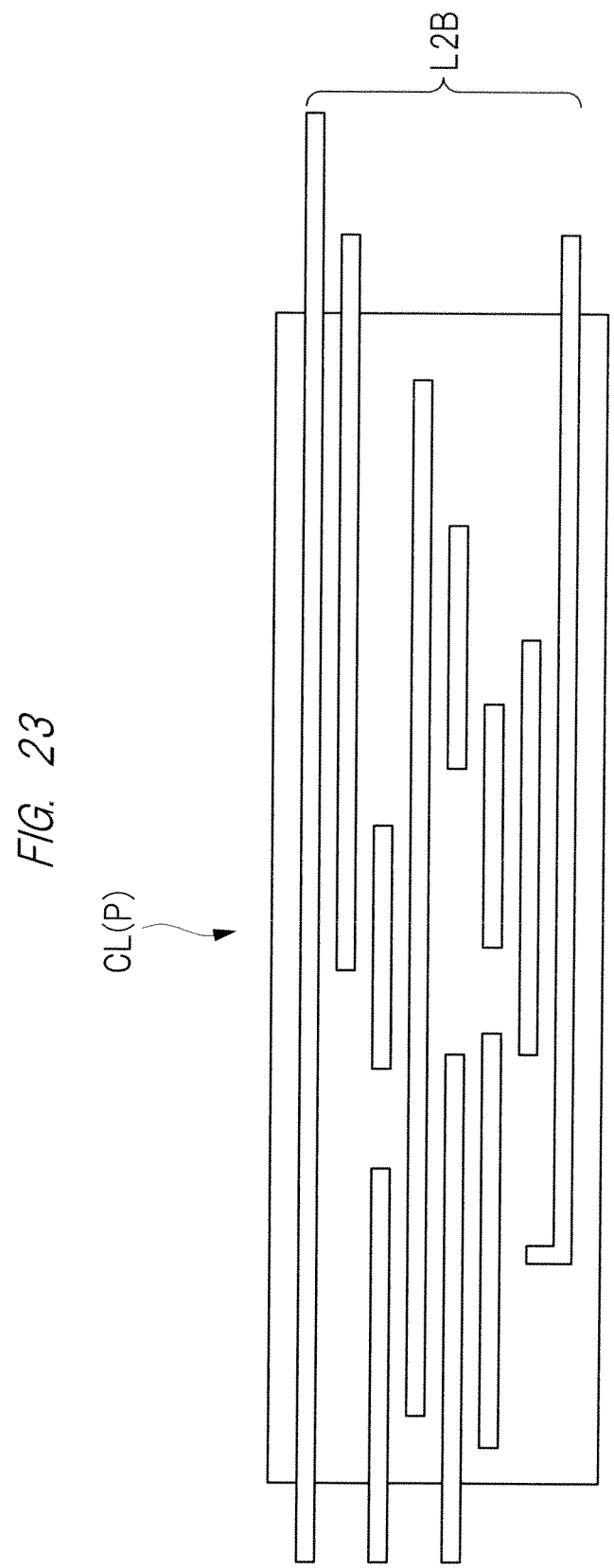
FIG. 23 is a diagram illustrating a wiring for connecting between the standard cells in the comparative example.

For example, FIG. 22 is a diagram illustrating a second wiring layer of a standard cell CL(P) in a comparative example. As illustrated in FIG. 22, in the standard cell CL(P) in the comparative example, wirings L2A of the second wiring layer are used to configure the standard cell CL(P). In the comparative example, since the second wiring layer is partially used as a wiring of the standard cell CL itself, limitation is more when the second wiring layer is used as the wiring for connecting between the standard cells CL. FIG. 23 is a diagram illustrating wirings L2B for connecting between standard cells CL in the comparative example. These wirings L2B have to be arranged so as to avoid the wirings L2A illustrated in FIG. 22, and therefore, it is found that there are many limitations in the layout and the layout cannot be efficiently made.

On the other hand, in the fifth embodiment, even in the case of application of the new layout rule, a sufficient space is ensured inside the standard cell CL by using the technical idea of the present invention. From this, even in a complicated standard cell CL such as the flip-flop circuit with the SCAN function, the standard cell CL can be configured of only the first wiring layer and a component in the lower layer than this first wiring layer. Therefore, it is not required to use the second wiring layer which is the upper layer than the first wiring layer as the wiring for the standard cell CL itself, and the second wiring layer can be freely used for the connection between the standard cells CL. As a result, the degree of flexibility of the wiring layout is improved, and the wiring can be efficiently laid out, and therefore, the size of the entire semiconductor device can be reduced.

In the foregoing, the invention made by the inventor has been concretely described based on the embodiments. However, it is needless to say that the present invention is not limited to the foregoing embodiments and various modifications and alterations can be made within the scope of the present invention.

Many standard cells of the first to fifth embodiments are arranged on a chip. In any of the standard cells, protruding wirings are configured to have almost the same height, and therefore, the standard cells can be arranged with taking a dummy gate electrode and a protruding wiring as a cell boundary without providing a useless space regardless of a function of each cell and a degree of a length thereof in the X direction. In this manner, the layout efficiency can be increased.

Finally, main different points between Patent Document 1 descried in BACKGROUND ART and the present invention will be explained. A first different point between Patent Document 1 and the present invention is that, while a new layout rule such as a rule in which gate electrodes (polysilicon films) are arranged at the same interval and the gate electrodes have straight-line shapes without being bent at all or a rule in which a diffusion layer has a figure shape with eight or less vertexes is taken in the present invention, the technique of Patent Document 1 does not assume such a layout rule.

Patent Document 1 describes a layout structure in which a power supply wiring connected to a diffusion layer is drawn out onto a boundary line between adjacent standard cells. Therefore, also in Patent Document 1, it can be said that protruding wirings are drawn out from corners of the standard cell. However, Patent Document 1 is different from the technical idea of the present invention in that a bent portion is not provided to the protruding wirings drawn out from the corners of the standard cell. In Patent Document 1, the diffusion layer in the standard cell is connected into one between adjacent standard cells, and therefore, power can be fed to the diffusion layer formed so as to across the boundary line between the standard cells by only drawing out a linear protruding wiring from a corner of the standard cell. On the other hand, in the present invention, the diffusion layer is divided for each standard cell, and the diffusion layer is not formed even on the boundary line between the standard cells. Therefore, power cannot be fed to the diffusion layer by only the protruding wiring drawn onto the boundary line between the standard cells, and therefore, it is required to provide a bent portion which is bent from the protruding wiring toward the inside of the standard cell to feed the power to the diffusion layer. As described above, it is found that there is a second large different point between Patent Document 1 and the present invention.

Further, in Patent Document 1, an inverter circuit is merely cited as an example of the standard cell. That is, only a case that both of the adjacent standard cells are inverter circuits is described. Therefore, for example, when a case that the adjacent standard cells are an inverter circuit and an NOR circuit is considered, the following inconvenience occurs. In the case that both of them are the inverter circuits, a diffusion layer to be a source region can be connected into one between the adjacent standard cells. However, in the case that the inverter circuit and the NOR circuit are adjacent to each other, a source region of the inverter circuit and a drain region of the NOR circuit are adversely connected to each other, and the diffusion layer cannot be connected into one. That is, the technique of Patent Document 1 cannot be applied to the case that the inverter circuit and the NOR circuit are adjacent to each other, and it can be said that the technique is lack of versatility.

Figure 24:
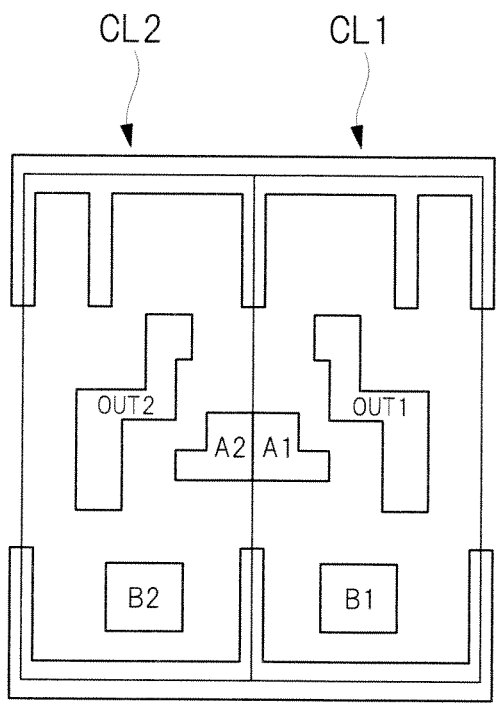
FIG. 24 is a diagram illustrating an example of application of a technique described in Patent Document 1 to a two-input NAND circuit.
Figure 25:
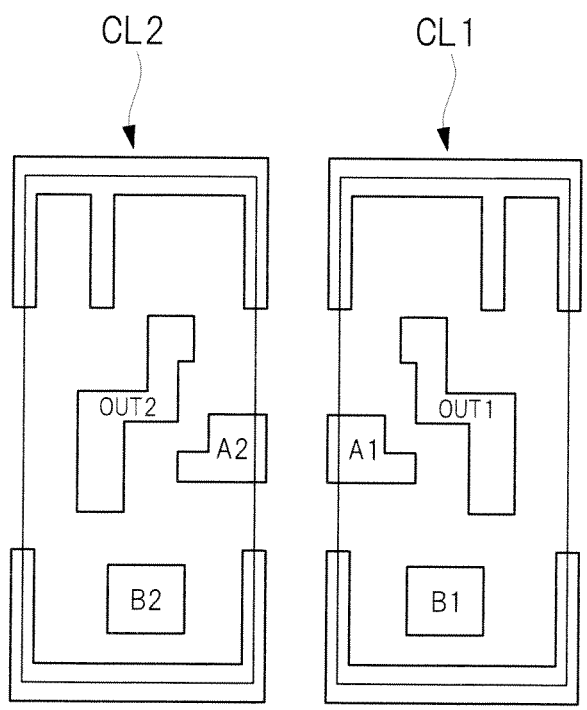
FIG. 25 is a diagram illustrating an example of application of a technique described in Patent Document 1 to a two-input NAND circuit.

Also, a case that the adjacent standard cells are two-input NAND circuits will be considered. FIG. 24 is a diagram illustrating an example that the technique described in Patent Document 1 is applied to the two-input NAND circuits. As illustrated in FIG. 24, an input wiring A1, an input wiring B1, and an output wiring OUT1 are formed in a standard cell CL1, and an input wiring A2, an input wiring B2, and an output wiring OUT2 are formed in a standard cell CL2. If these standard cells CL1 and CL2 are adjacently arranged based on the technique described in Patent Document 1, the input wiring A1 of the standard cell CL1 and the input wiring A2 of the standard cell CL2 are adversely in contact with each other. Therefore, as illustrated in FIG. 25, when the adjacent standard cells CL1 and CL2 are the two-input NAND circuits, it is required to set the standard cell C1 and the standard cell C2 to be distant from each other in order not to contact the input wiring A1 with the input wiring A2. Then, the size of the entire semiconductor device is increased.

Figure 18:
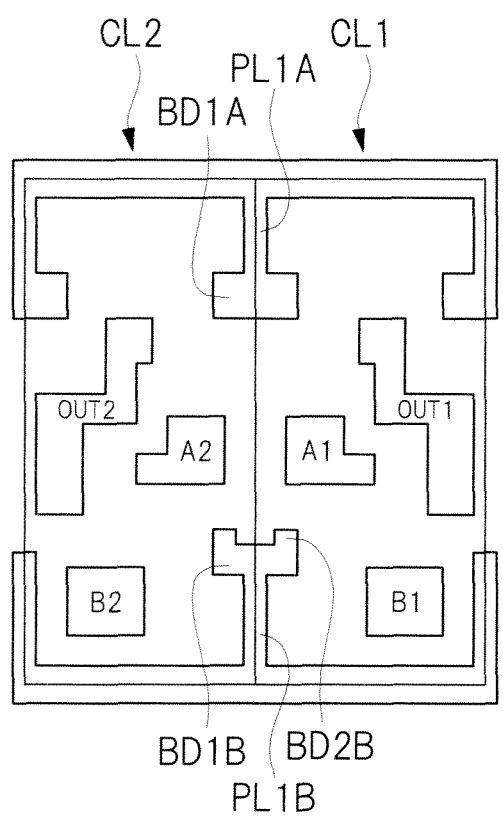
FIG. 18 is a diagram illustrating an example of application of a technical idea of the present invention to a two-input NAND circuit.

On the other hand, FIG. 18 is a diagram illustrating an example that the technical idea of the present invention is applied to the two-input NAND circuit. As illustrated in FIG. 18, in the present invention, since the bent portion BD1A is formed in the protruding wiring PL1A and the bent portion BD1B and the bent portion BD2B are formed in the protruding wiring PL1B, it is found that the input wiring A1 and the input wiring A2 can be prevented from being in contact with each other. As described above, the technical idea of the present invention and the technique of Patent Document 1 are totally different techniques from each other.

INDUSTRIAL APPLICABILITY

The present invention can be widely used in a manufacturing industry which manufactures a semiconductor device.

SYMBOL EXPLANATION 1S semiconductor substrate
A input wiring
A1 input wiring
B input wiring
B1 input wiring
BD1A bent portion
BD1B bent portion
BD1B(1) bent portion
BD1B(2) bent portion
BD2A bent portion
BD2B bent portion
BD3A bent portion
C input wiring
CHP semiconductor chip
CIL contact interlayer insulating film
CL standard cell
CL1 standard cell
CL2 standard cell
CL3 standard cell
CL4 standard cell
CL5 standard cell
CL6 standard cell
CL(P) standard cell
CL1(P) standard cell
CL2(P) standard cell
CPU central processing unit
D input wiring
DG dummy gate electrode
DG1 dummy gate electrode
DG2 dummy gate electrode DR1 n-type power feeding region
DR2 p-type power feeding region
EX shallow p-type impurity diffusion region
G gate electrode
GOX gate insulating film
G1 gate electrode
G2 gate electrode
G3 gate electrode
G4 gate electrode
G5 gate electrode
G6 gate electrode
G7 gate electrode
IL1 interlayer insulating film
IN input wiring
IN1 input wiring
IN2 input wiring
IP three-dimensional image processor
L1 wiring
L1A power supply wiring
L1B power supply wiring
L1C wiring
L2 wiring
L2A wiring
L2B wiring
MCA memory cell array
NDR n-type semiconductor region
NDR1 n-type semiconductor region
NDR2 n-type semiconductor region
NR1 n-type power feeding region
NR2 deep n-type impurity diffusion region
NWL n-type well
N1 n-type MISFET
N2 n-type MISFET
N3 n-type MISFET
N4 n-type MISFET
N5 n-type MISFET
OUT output wiring
OUT1 output wiring
OUT2 output wiring
PC peripheral circuit
PDR p-type semiconductor region
PLG plug
PL1A protruding wiring
PL1B protruding wiring
PL1B(1) protruding wiring
PL1B(2) protruding wiring
PR1 p-type power feeding region
PR2 deep p-type impurity diffusion region
PWL p-type well
P1 p-type MISFET
P2 p-type MISFET
P3 p-type MISFET
P4 p-type MISFET
P5 p-type MISFET
RAM memory
SPU audio processor
STI element isolation region
SW sidewall
TP communication processor
VPU video processing unit

The invention claimed is:
1. A semiconductor device including a plurality of standard cells adjacently arranged along a first direction of a semiconductor substrate,
each of the plurality of standard cells having a rectangular shape, and including:
a first power supply wiring of a first wiring layer which extends on a first side along the first direction;
a second power supply wiring of the first wiring layer which extends on a second side so as to be distant at a predetermined interval from and in parallel to the first side and to which a voltage lower than a voltage of the first power supply wiring is applied,
a first semiconductor region and a second semiconductor region which are arranged so as to line in a second direction crossing the first direction between the first power supply wiring and the second power supply wiring within the semiconductor substrate, the first semiconductor region being arranged on a side of the first power supply wiring and the second semiconductor region being arranged on a side of the second power supply wiring;
a plurality of gate electrodes which extend in the second direction and which are formed on the semiconductor substrate at a same interval in the first direction;
two first protruding wirings which branch from the first power supply wiring at both ends of the first side and which protrude in the second direction toward an inside of said each of the plurality of standard cells; and
two second protruding wirings which branch from the second power supply wiring at both ends of the second side and which protrude in the second direction toward the inside of said each of the plurality of standard cells,
wherein at least one or more protruding wirings extracted from the first protruding wirings and the second protruding wirings include a first bent portion bent at an end of at least one or more protruding wirings in the first direction toward the inside of said each of the plurality of standard cells,
wherein, when the protruding wiring including the first bent portion formed therein branches from the first power supply wiring, the protruding wiring is electrically connected to a first source region formed in the first semiconductor region via a first plug connected to the first bent portion,
wherein, when the protruding wiring including the first bent portion formed therein branches from the second power supply wiring, the protruding wiring is electrically connected to a second source region formed in the second semiconductor region via a second plug connected to the first bent portion,
wherein, in a plan view, a part of the first bent portion is overlapped with a part of the first source region or the second source region.
2. The semiconductor device according to claim 1, wherein, in the plurality of standard cells adjacently arranged, the first semiconductor region formed in said each of the plurality of standard cells is isolated from another first semiconductor region, and the second semiconductor region formed in said each of the plurality of standard cells is isolated from another second semiconductor region.
3. The semiconductor device according to claim 2, wherein the first semiconductor region formed in said each of the plurality of standard cells is arranged so as not to be in contact with both of a first boundary line which connects between one end of the first side of said each of the plurality of standard cells and one end of the second side thereof and a second boundary line which connects between the other end of the first side thereof and the other end of the second side thereof, and
wherein the second semiconductor region formed in said each of the plurality of standard cells is arranged so as not to be in contact with both of the first boundary line which connects between one end of the first side of said each of the plurality of standard cells and one end of the second side thereof and the second boundary line which connects between the other end of the first side thereof and the other end of the second side thereof.

4. The semiconductor device according to claim 1, wherein, when the protruding wiring including the first bent portion formed therein is the first protruding wiring, at least one or more first connecting wirings of the first wiring layer which extend in the first direction are formed in a distant region between the first power supply wiring which extends in the first direction and the first bent portion which is bent in the first direction.

5. The semiconductor device according to claim 4, wherein the first connecting wiring includes a wiring for electrically connecting among two or more gate electrodes included in the plurality of gate electrodes.

6. The semiconductor device according to claim 1, wherein, when the protruding wiring including the first bent portion formed therein is the second protruding wiring, at least one or more first connecting wirings of the first wiring layer which extend in the first direction are formed in a distant region between the second power supply wiring which extends in the first direction and the first bent portion which is bent in the first direction.

7. The semiconductor device according to claim 6, wherein the first connecting wiring comprises a wiring for electrically connecting among two or more gate electrodes included in the plurality of gate electrodes.

8. The semiconductor device according to claim 1, wherein the protruding wiring including the first bent portion forming therein further includes a second bent portion which is bent from an end of the first bent portion in the second direction.

9. The semiconductor device according to claim 8, wherein the protruding wiring including the first bent portion and the second bent portion formed therein is the first protruding wiring, the protruding wiring including the first bent portion and the second bent portion formed therein is electrically connected to the first semiconductor region via a third plug connected to the second bent portion.

10. The semiconductor device according to claim 8, wherein the protruding wiring including the first bent portion and the second bent portion formed therein includes the second protruding wiring, the protruding wiring including the first bent portion and the second bent portion formed therein being electrically connected to the second semiconductor region via a fourth plug connected to the second bent portion.

11. The semiconductor device according to claim 1, wherein at least one or more protruding wirings extracted from the first protruding wirings and the second protruding wirings include two first bent portions whose ends are bent in the first direction toward the inside of said each of the plurality of standard cells which are adjacently arranged.

12. The semiconductor device according to claim 1, wherein said each of the plurality of standard cells further includes:
an input wiring which is formed in a first wiring layer and which inputs an input signal to said each of the plurality of standard cells; and
an output wiring which is formed in the first wiring layer and which outputs an output signal from said each of the plurality of standard cells, and
wherein the input wiring and the output wiring are electrically connected to a wiring in an upper layer than the first wiring layer.

13. The semiconductor device according to claim 1, wherein each of the first semiconductor region and the second semiconductor region has a rectangular shape with four vertexes.

14. The semiconductor device according to claim 1, wherein a minimum line width of each of the first protruding wirings and a minimum line width of each of the second protruding wirings are smaller than a line width of the first power supply wiring or a line width of the second power supply wiring.

15. The semiconductor device according to claim 1, wherein an N-type well is formed in the semiconductor substrate, and the first power supply wiring and the N-type well are electrically connected to each other via a plurality of first via plugs, and
wherein a P-type well is formed in the semiconductor substrate, and the second power supply wiring and the P-type well are electrically connected to each other via a plurality of second via plugs.

16. The semiconductor device according to claim 15, wherein the plurality of first via plugs and the plurality of second via plugs are not formed at four corners of said each of the plurality of standard cells.

17. The semiconductor device according to claim 1, wherein said each of the plurality of standard cells further includes a third protruding wiring which branches from the first power supply wiring at a place except for the both ends of the first side and which protrudes in the second direction toward an inside of said each of the plurality of standard cells, and
wherein the third protruding wiring is electrically connected to the first semiconductor region via a fifth plug.

18. The semiconductor device according to claim 1, wherein said each of the plurality of standard cells further includes a fourth protruding wiring which branches from the second power supply wiring at a place except for the both ends of the second side and which protrudes in the second direction toward an inside of said each of the plurality of standard cells, and
wherein the fourth protruding wiring is electrically connected to the second semiconductor region via a sixth plug.

19. The semiconductor device according to claim 1, wherein said each of the plurality of standard cells is configured to be used for a digital circuit.

20. The semiconductor device according to claim 1, wherein, in a plan view, MISFETs are formed in respective regions where the gate electrodes overlap with the first and second semiconductor regions.

21. The semiconductor device according to claim 1, further comprising:
a first dummy gate electrode and a second dummy gate electrode each extending in the second direction,
wherein the first dummy gate electrode, the gate electrodes, and the second dummy gate electrode are arranged in the first direction in this order.

22. The semiconductor device according to claim 21, wherein, in a plan view, the first and the second dummy gate electrodes are disposed outside the first and the second semiconductor regions.

23. The semiconductor device according to claim 21, wherein, in a plan view, the first and the second dummy gate electrodes are disposed on a boundary line between the standard cells.

24. The semiconductor device according to claim 21, wherein, in a plan view, an entirety of the first and the second dummy gate electrodes are disposed outside the first and the second semiconductor regions.

25. The semiconductor device according to claim 21, wherein, in a plan view, a part of one of the first protruding wirings and a part of one of the second protruding wirings are overlapped with a part of the first dummy gate electrodes, and a part of an other one of the first protruding wirings and a part of an other one of the second protruding wirings are overlapped with a part of the second dummy gate electrodes.

* * * * *